United States Patent [19]

Jackson

[11] Patent Number: 4,908,576
[45] Date of Patent: Mar. 13, 1990

[54] SYSTEM FOR PRINTED CIRCUIT BOARD TESTING

[76] Inventor: Daniel K. Jackson, 13580 SW. A Goodall Rd., Lake Oswego, Oreg. 97034

[21] Appl. No.: 94,407

[22] Filed: Sep. 8, 1987

[51] Int. Cl.$^4$ .................... G01R 31/28; G06F 11/00
[52] U.S. Cl. ................. 371/22.3; 324/158 F; 324/23.1; 324/158 R; 324/158 P; 371/25.1
[58] Field of Search ........ 324/73 PC, 73 AT, 158 F, 324/158 P, 115, 72.5, 121 R; 371/20, 25, 16

[56] References Cited

U.S. PATENT DOCUMENTS

| | | | |
|---|---|---|---|
| 3,585,500 | 6/1971 | Grubel | 324/73 R |
| 3,848,188 | 11/1974 | Ardezzone et al. | 324/73 AT X |
| 3,922,537 | 11/1975 | Jackson | 324/73 X |
| 3,976,940 | 8/1976 | Chau et al. | 324/73 X |
| 4,044,244 | 8/1977 | Foreman et al. | 324/73 X |
| 4,176,780 | 12/1979 | Sacher et al. | 324/73 R |
| 4,180,203 | 12/1979 | Masters | 324/73 X |
| 4,195,258 | 3/1980 | Yen | 324/73 AT X |
| 4,348,759 | 9/1982 | Schnurmann | 324/73 AT X |
| 4,417,204 | 11/1983 | Dehmel et al. | 324/73 PC |
| 4,439,858 | 3/1984 | Petersen | 324/73 AT |
| 4,443,756 | 4/1984 | Lightbody et al. | 324/158 F X |
| 4,528,504 | 7/1985 | Thornton, Jr. et al. | 324/158 F X |
| 4,567,405 | 1/1986 | Bristol | 324/121 X |
| 4,593,243 | 6/1986 | Lao et al. | 324/158 F |
| 4,660,197 | 4/1987 | Wrinn et al. | 324/73 X |
| 4,714,875 | 12/1987 | Bailey et al. | 324/73 PC X |
| 4,724,379 | 2/1988 | Hoffman | 324/73 X |
| 4,743,839 | 5/1988 | Rush | 324/121 X |

OTHER PUBLICATIONS

"The L290"; Teradyne; 1985.
Cohen, Stephen A.; "A New Pin Electronics Architecture for High Performance Functional Module Testing"; 1986 IEEE; pp. 763–770.
Cohen, Stephen A. et al., "Maintaining Timing Accuracy in High Pin-Count VLSI Module Test Systems," 1987.

Primary Examiner—Reinhard J. Eisenzof
Assistant Examiner—Vinh P. Nguyen
Attorney, Agent, or Firm—Marger & Johnson, Inc.

[57] ABSTRACT

A system is described for connecting a printed circuit board (PCB) under test to a digital analysis unit to permit verification of the functional behavior of the PCB. A bed-of-nails (BON) fixture is employed, allowing access to internal circuit nodes of the PCB. Controlled-impedance wiring, terminated in its characteristic impedance at the test electronics, allows high speed signals to be communicated without degradation from the unit under test (UUT). Excessive dynamic loading of the UUT circuit nodes is avoided by employing isolation resistance at each BON probe. The potentially large number of UUT signals to be monitored is multiplexed down to a smaller number of lines more readily accommodated by the digital analysis unit. The selected signals from the UUT are processed in a wide-band asynchronous manner by the test electronics in such a way that uniform delay of all signals through the multiplexer is achieved. The digital analysis unit is able to monitor the operation of the UUT just as well as if neither the BON nor any intervening electronics were present. The high-speed functional behavior of the PCB itself remains essentially unaffected by the presence of the BON, test electronics and digital analysis unit.

64 Claims, 24 Drawing Sheets

1

SYSTEM FOR PRINTED CIRCUIT BOARD TESTING

BACKGROUND OF THE INVENTION

This invention relates to methods and apparatus for electrical testing of printed circuit boards and more particularly to functional testing of high-speed digital printed circuit boards.

The availability of high performance modular digital test instrumentation suggests such equipment could be applied in non-traditional applications, such as printed circuit board (PCB) test. The use of digital pattern generators to provide input stimulus to the unit under test (UUT) and digital analysis units (logic analyzers) to obtain and verify the responses of the UUT permits a low cost, modular, high performance means of testing PCB functionality to be realized.

This approach is well suited to verifying the functional operation of the UUT by examining the output signals generated by the PCB. Controlled-impedance wiring (twisted pair or shielded cable) can be used to deliver the signals from the pattern generator to the UUT card-edge connector; use of terminating resistors there can insure proper delivery of high speed stimulus. Signal probes of the logic analyzer can be connected directly to the card-edge connector; the high-impedance analyzer inputs are physically only a short distance from the signal sources on the PCB. The high speed signal behavior of the UUT can readily be monitored by the logic analyzer.

A drawback of this approach, commonly referred to as "functional testing," is that while determination of whether the UUT is properly functional or not may be made, determination of the cause of failure may be quite difficult. A superior approach would employ a bed-of-nails (BON) to allow access to the internal nodes of the PCB. While still applying stimulus to the UUT inputs, more comprehensive testing could be carried out by observing the behavior of any and all device signals on the PCB. Verification of pass/fail functionality could still be made, and determination of exactly which device output(s) first behaved in an other-than-expected fashion, at exactly which point in the stimulus sequence, becomes possible.

Determination of pass/fail functionality is made through comparison of the UUT behavior against a reference. This reference may be taken from the output of a logic simulation program (such as could be run on a computer-aided engineering (CAE) workstation). Alternatively, the actual behavior (not simulated) of a known-good PCB in response to the pattern generator stimulus could be recorded by the logic analyzer and the information stored for future comparison use.

Unfortunately, two problems prevent the efficient application of test instrumentation to PCB functional test using BON fixturing. The first has to do with the electrical characteristics of the fixture. Conventionally, the wiring in the BON fixture (connecting the spring-loaded probes, which press against the PCB nodes, to connectors on the back or bottom of the fixture) is composed of many individual unshielded runs, each possibly several feet in length. Signals, especially if they are high speed, are thus subject to crosstalk and noise. The electrical environment is unpredictable since the wiring impedance is not controlled. Furthermore, the effects of the wiring on the electrical behavior of the signals is significant, especially in high speed situations. Ringing and reflections cause the waveforms seen by the logic analyzer to no longer resemble the actual UUT circuit node behavior. Dynamic loading of the PCB circuit nodes by the fixture wiring alters the electrical behavior of the UUT nodes compared with their behavior when not on the BON.

This problem can be solved by building a testing system which has been specially engineered to keep the electrical distance of the test electronics from the UUT very short. This approach, employed by high-end "combinational" testers, uses wire lengths within the BON fixture of less than six inches. UUT loading and signal ringing and reflections are all thereby reduced to acceptable levels. The price of such a system is high because of the significant development expense involved; the special short-wire fixtures required are also relatively expensive.

An alternative solution is to place active buffering at each UUT node within the BON fixture. The buffers reduce loading on the UUT nodes and are able to drive terminated controlled-impedance lines of significant length. This approach is economically unfeasible due to the number of buffers required for a typical-size PCB, especially in view of the fact that each board type to be tested requires its own fixture.

The second problem comes from the recognition that PCB's may have up to thousands of nodes which need to be monitored, while logic analyzers usually have no more than one hundred signal inputs. Even the highest-end analysis units, such as Jektronix model DAS9200, are expandable to no more than five hundred inputs, typically at significant expense.

Without economic solution of these problems, BON-based high performance digital functional testing employing modular digital test instrumentation remains impracticable. Accordingly, a need remains for an improved way to functionally test high-speed, multi-node digital printed circuit boards.

BRIEF SUMMARY OF THE INVENTION

One object of the invention is to enable conventional bed-of-nails fixturing to be used to monitor the high speed functioning of the PCB UUT transparently, i.e. without significant interference in the electrical behavior of the circuit nodes of the UUT and without significantly distorting or degrading the characteristics of the signals presented to the analysis unit for examination.

Another object is to enable analysis units which have relatively few signal inputs to be used in verifying the high speed functionality of PCB's with relatively many circuit nodes.

A further object is to realize connection of the UUT to the analysis unit in an "logically transparent" manner (in which no presumptions are made about the timing relationships of the signals being monitored).

An additional object is to enable the full capabilities of the analyzer to be brought to bear in determining proper/improper circuit functioning. This is important since practical designs often involve multiple or asynchronous clocks and timing-sensitive circuitry, the testing of which requires the application of sophisticated logic analysis techniques.

Briefly, a preferred implementation of the present invention utilizes a multiplexer subsystem to connect a first plurality of test signals from a unit under test (UUT) to analysis instrumentation having a third plurality (usually less than the first) of inputs. The subsystem allows selection of a subset of all UUT signals to be presented to the analysis instrumentation for examination. Connection of the UUT to the subsystem is by means of a conventional bed of nails test fixture (BON) using controlled-impedance wiring and isolating resistors wired in series with the second plurality of BON probes in accordance with the invention.

The multiplexer subsystem is implemented modularly using one type of PCB containing front end (signal regeneration) and switching network circuitry (FESN PCB), as well as a second type of PCB containing delay adjustment circuitry (DA PCB). Groups composed of several FESN's together with one DA are formed; the FESN's select input signals of interest from the UUT while the DA adjusts the timing delay of the signal paths so that all signals are delayed equally as they travel from the UUT to the analysis instrumentation.

In another aspect of the invention, the FESN and DA PCB's include timing calibration circuitry. Propagation delays through the subsystem are determined by measuring the period of oscillation of various closed-loop paths in the system. Timing calibration is performed by adjusting the delay of the DA circuitry so that all propagation delays are uniform (or otherwise as desired).

Propagation delay measurements are performed in a series of steps in which the periods of oscillation around successively larger closed loop paths are determined. Each loop has a portion which is coincident with some portion of its predecessor loop. Given that the delay around the larger loop is measured, and that the delay through the coincident portion of the smaller loop is already determined, the delay through the non-coincident portion of the larger loop becomes known. Portions of certain of the loops are implemented in a "mirror-symmetric" fashion so that the delay to the midpoint of the loop portion may be inferred from the delay along the entire loop portion.

The foregoing and other objects, features and advantages of the invention will be apparent from the following detailed description of a preferred embodiment of the invention as illustrated in the accompanying drawings.

DESCRIPTION OF THE INVENTION

Figure 1:
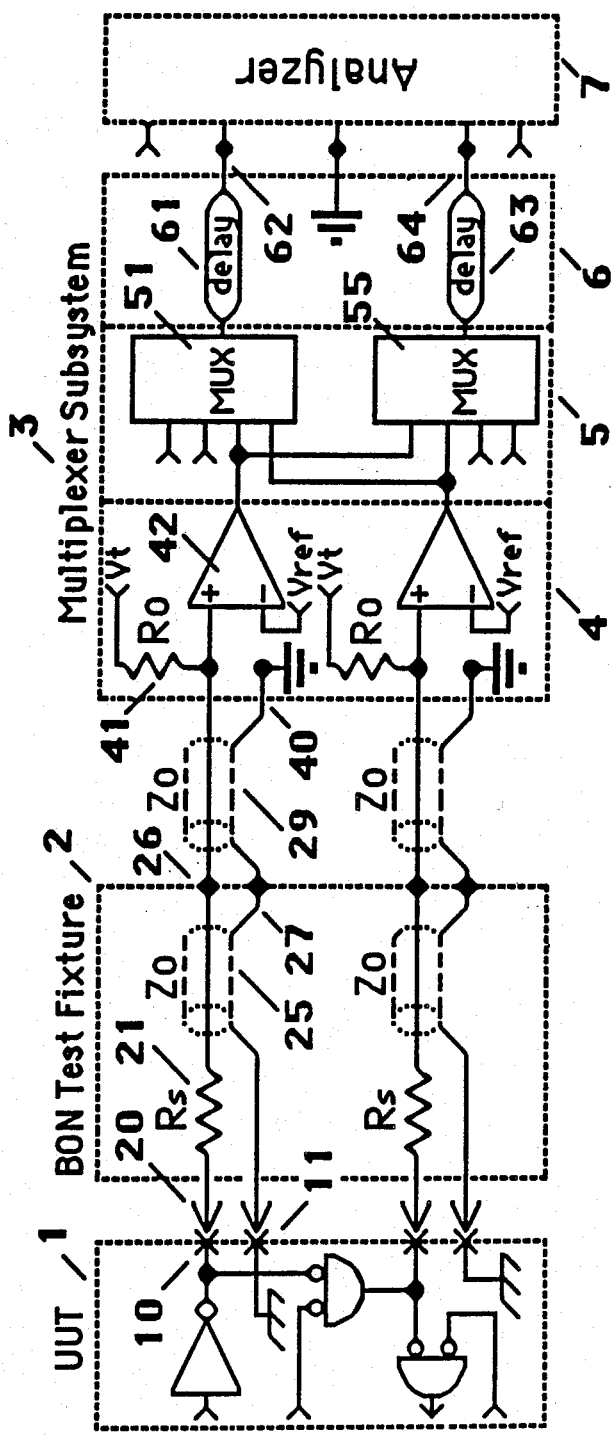
FIG. 1 is a mixed block and logic diagram of a typical test configuration according to the invention, showing a portion of the UUT, the BON fixture, essential aspects of the multiplexer subsystem and an analyzer.

As shown in FIG. 1, the unit under test (UUT) 1 contacts a bed-of-nails (BON) test fixture 2. Signals from the UUT are communicated to a multiplexer subsystem 3 where they are processed before being passed out to analyzer 7 for interpretation.

In more detail, each UUT circuit node 10 to be monitored is connected via a BON fixture probe 20 and an isolation resistance 21, through controlled-impedance wiring 25 and 29, to the multiplexer subsystem 3. The multiplexer subsystem is essentially composed of three sections. The front end 4 regenerates the incoming signals from the UUT for use by the switching network 5. The switching network selects a subset of all the input signals for transmission through to the analyzer. In section 6 delay adjustment means such as adjustable delay 61 are incorporated to allow the delay of the signal paths through the multiplexer to be controlled so that minimum timing skew may be realized.

UUT Probing

Conventional bed-of-nails fixturing is used as the intermediary between the UUT and the verification electronics. This results in interconnecting cabling whose electrical length is quite significant compared with the wavelengths of the frequency components of the signals from the UUT. The impedance of such signal wiring cannot be ignored as far as its effect upon the behavior of UUT circuitry is concerned. To lessen the loading effect on the sampled nodes of the relatively low impedance of the cabling, an isolation resistance 21 is placed at each probe in series with the cabling.

A voltage divider is formed between the isolation resistance and the impedance of the signal wiring. This implies that the value of isolation resistance should be large enough to provide adequate impedance buffering, yet not so large that the signal level becomes impractically small. Therefore, while a uniform value of resistance could be chosen for use with all types of UUT nodes, in practice the value of resistance will be determined by the type of logic being monitored.

For example, low impedance circuitry, such as emitter-coupled logic (ECL), could well be probed using isolation resistances on the order of 1K$\Omega$; transistor-transistor logic (TTL) and complementary metal oxide semiconductor (CMOS) circuits could better tolerate resistance values of 10K$\Omega$.

Figure 2:
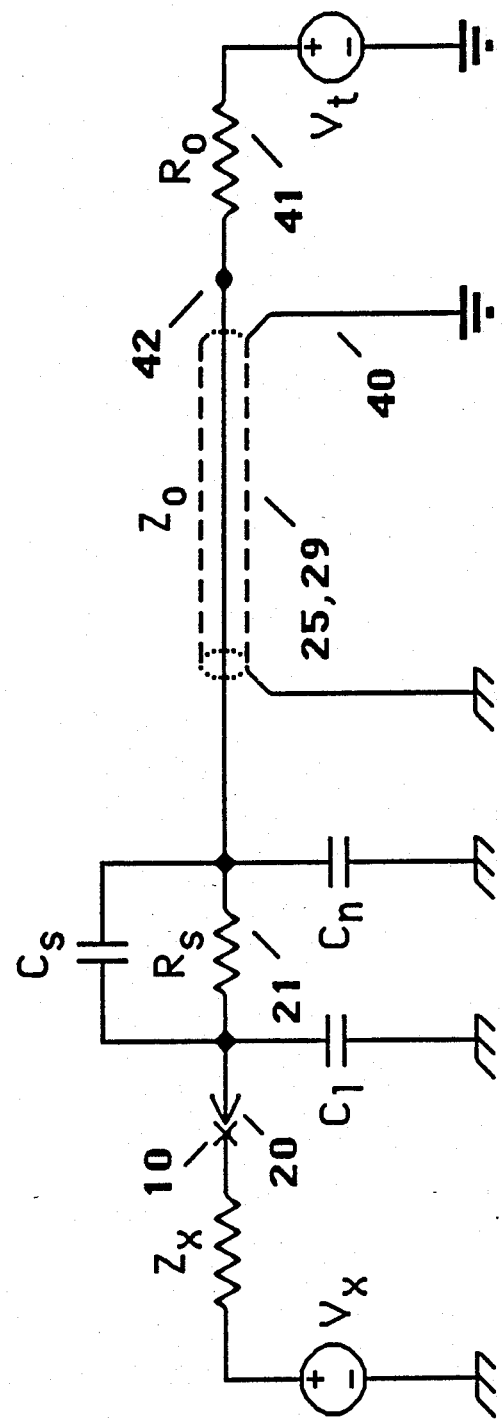
FIG. 2 is an equivalent electrical circuit of the UUT node, probe resistance, controlled-impedance wiring and termination of FIG. 1.

FIG. 2 shows the equivalent electrical circuit of the UUT node, probe resistance, controlled-impedance cabling and termination. The UUT circuitry is modeled as a voltage source, $V_x$, and a series impedance $Z_x$ (which in general may be nonlinear and time varying). $C_l$ represents the stray capacitance present at the probe input, and is experienced as a load by the UUT circuit. $C_s$ represents the capcitance associated with probe isolation resistance, $R_s$; components of this are the lead-to-lead capacitance of the resistor body plus the internal distributed capacitance of the resistance material (due to the graphite clay mixture in the case of a carbon composition resistor). $C_n$ represents the stray capacitance at the resistor-transmission line node.

Figure 3:
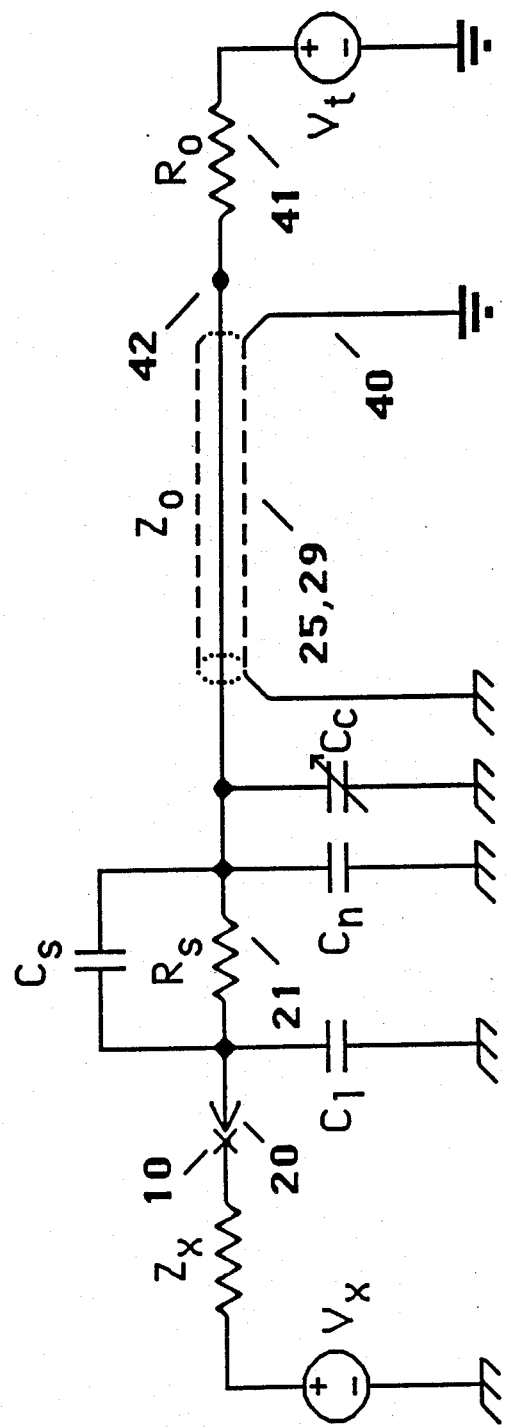
FIG. 3 is an equivalent electrical circuit, similar to FIG. 2, wherein use is made of a variable compensating capacitor.

With high speed digital signals having edge rates on the order of 1 Volt/nanosecond, and $R_s$ as high as 10K$\Omega$, $C_s$ need not be large at all for significant waveform distortion (differentiation) to result. In general, minimizing such distortion requires use of a compensation capacitor, $C_c$ (refer to FIG. 3), such that:

$$Z_o(C_c+C_n)=R_sC_s \quad [1]$$

Since the values of $C_n$ and $C_s$ are not precisely known, $C_c$ would need to be adjustable to achieve proper compensation. Requiring a manually-adjusted capacitor to be present at each probe input in the test fixture is not considered practical, however.

An alternative is to make the $R_sC_s$ time constant small by reducing the value of $R_s$. However, as discussed above, this would adversely affect the loading of the UUT circuitry.

Figure 4:
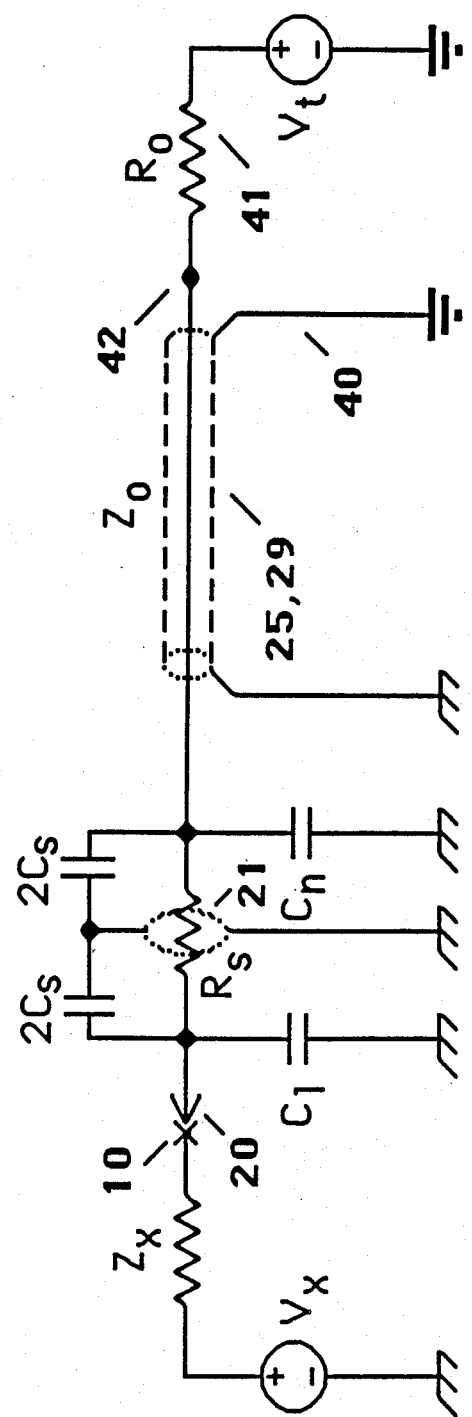
FIG. 4 is an equivalent electrical circuit of a preferred implementation of FIG. 2, wherein shielding is applied to the isolation resistor.

Another alternative may be practiced: reducing the value of $C_s$. This may be accomplished, for example, by shielding the body of the isolation resistor. Where a carbon composition resistor is used, wire or foil wrapped around the resistor and grounded terminates the electric field lines emanating from the resistor leads as well as from within the resistor body. This results in a lower value of $C_s$. FIG. 4 shows the circuit equivalent result. While the effective capacitances at the probe and transmission line nodes are increased, the parallel capacitance experienced by $R_s$ is reduced.

Low values of $C_s$ may be achieved alternatively by implementing $R_s$ as a film resistor on a ceramic substrate, with close attention paid to physical layout and substrate grounding.

Signal Wiring

Referring again to FIG. 1, controlled impedance wiring is used in the BON fixture (25), as well as between the fixture and the multiplexer subsystem (29), to properly transmit high speed signals with a minimum of noise and crosstalk. Each signal thereby has its own transmission line environment. Note that every signal run in the fixture connects to a UUT ground (11, for example, close by to the UUT circuit node 10 being probed), as well as to its own multiplexer subsystem ground connection (40, for example).

Since UUT ground points are connected to multiplexer subsystem ground points via the transmission lines, coaxial (shielded) cable is the preferred wiring means rather than twisted pair runs. This insures that unbalanced ground loop currents, flowing through the return conductor of each signal run, will interfere minimally with the low amplitude signals being communicated. Twisted pair wiring can be utilized for the transmission lines, however, in instances where signal risetimes or fall times are slow or testing to a high degree of precision is not required.

Multiplexer Front End

The controlled impedance lines 25 and 29 of FIG. 1 have a characteristic impedance of $Z_0$; they are terminated at the multiplexer front end 4 in their characteristic impedance by resistor 41 of value $R_0$.

In order that the load placed upon the UUT circuit node be as minimally disruptive of UUT voltage levels as possible, the termination resistor is returned to a termination voltage, $V_t$, rather than simply to ground. $V_t$ is chosen in accordance with the type of logic being monitored. For example, for monitoring ECL circuitry, $V_t$ may be set to $-2$ Volts ($-5.2$ Volts in some instances); for TTL, a termination voltage of $+5$ Volts may be set.

Voltage comparator 42 transforms the low-level signal at its "+" input into a normal amplitude digital signal for use by the switching network 5. The comparator must exhibit a very wide bandwidth if high speed UUT signals are to be monitored, and must be able to operate properly with only small amplitude differential input signals. It also must have a large common mode input voltage range in order that $V_t$ be set to accommodate a variety of logic families.

The voltage $V_{ref}$ at the "$-$" input of the comparator is set so that the presence of voltages at UUT node 10 exceeding the switching threshold for the type of logic monitored results in a high level output from the comparator; voltages below the switching threshold result in a low level output. For example, for monitoring ECL circuitry, $V_{ref}$ may be set so that the comparator switches when the UUT node voltage crosses $-1.2$ Volts; for TTL, $V_{ref}$ may be set so switching occurs for a UUT node voltage of $+1.4$ Volts.

There is one comparator in the multiplexer subsystem for each UUT node monitored.

Switching Network

The output from all comparators in the front end are passed to conventional digital multiplexers, such as 51, which select one input signal for presentation to analyzer 7 (at output 62).

As shown in FIG. 1, another digital multiplexer, 55, associated with another subsystem output, 64, has access to some or all of the same input signals to which digital multiplexer 51 is connected. This crossbar arrangement means that a UUT input signal is available via more than just a single subsystem output. Delays (such as 61 and 63) provide means to adjust the propagation delay of each signal output to the analyzer so that every signal experiences the same total propagation delay as any other signal output.

The outputs, such as 62 and 64, are typically far fewer in number than the number of UUT nodes being monitored.

Delay Adjustment Section

As shown in FIG. 1, an adjustable delay is associated with each multiplexer of the switching network and therefore with each output of the multiplexer subsystem. The delays adjust the overall propagation delay of each output so that all have the same timing relationship as the signal sensed at the circuit test nodes.

Subsystem Organization

Figure 5:
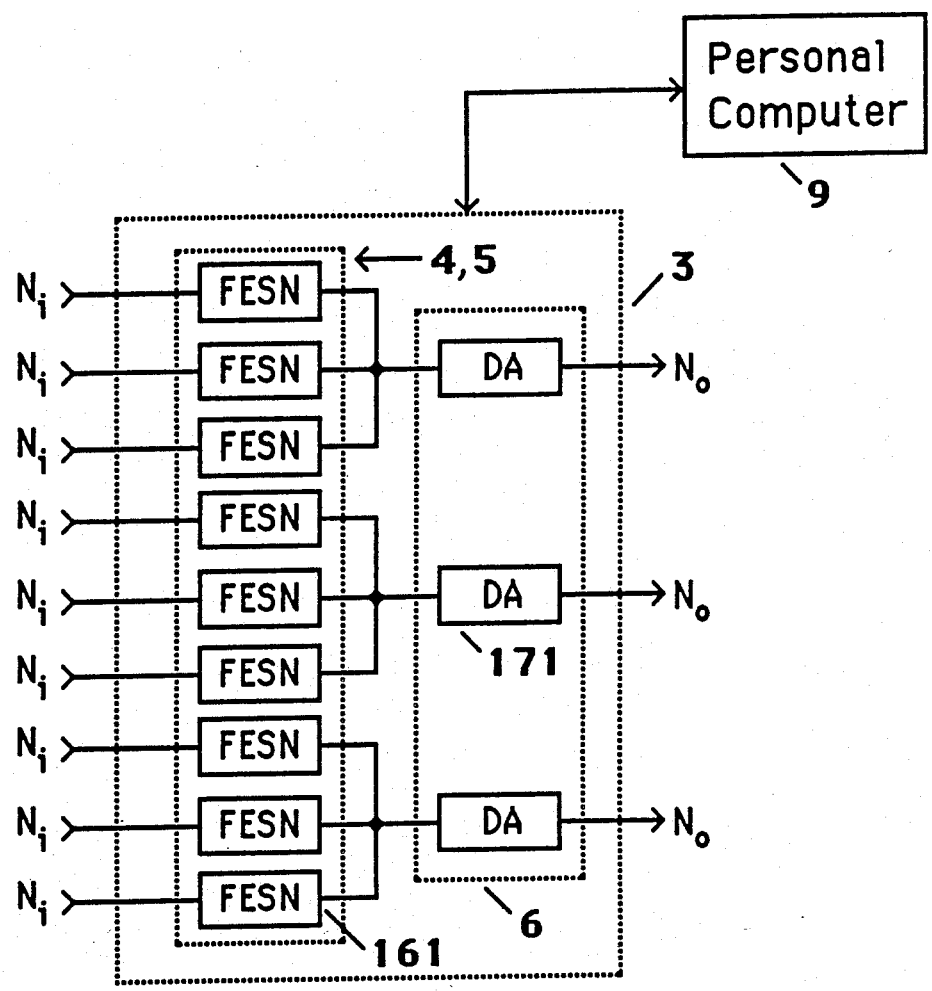
FIG. 5 is block diagram showing a preferred modular organization of the multiplexer subsystem of FIG. 1.

In order to accomodate UUT's having large numbers of circuit nodes, the multiplexer subsystem 3 is implemented modularly as shown in FIG. 5. Each block represents a portion of the multiplexer subsystem implemented on one PCB. Two types of PCB are shown: the Front End Switching Network ("FESN") PCB 161 containing front end and switching network circuitry, and the Delay Adjustment ("DA") PCB 171 containing delay adjustment circuitry. Each FESN PCB accepts $N_i$ inputs and produces $N_o$ outputs; the DA PCB has $N_o$ inputs and $N_o$ outputs. $N_i=64$ and $N_o=8$ in one preferred implementation.

Several FESN PCB's are logically gathered together to form a "group" as shown in FIG. 5; the $N_o$ outputs of each FESN are connected, together with the outputs from the other FESN's in the group, to the $N_o$ inputs of the DA. Any FESN in the group can be selected as the source of each of the $N_o$ inputs to the DA. (FIG. 5 simplisticly shows an OR-tie type bussing connection among the FESN's, whereas an active buss-repeatering technique is actually used in the preferred implementation as explained in *FESN Architecture*.) With three FESN's in a group as shown in FIG. 5, $N_o$ UUT signals are chosen from among each set of $3N_i$ inputs.

The size of the groups is not fixed, allowing configurations to be set up which best meet the requirements of each particular testing situation. For example (assuming $N_i$ is 64 and $N_o$ is 8), a multiplexer subsystem with 8 FESN's and 1 DA allows an analyzer with 8 inputs to monitor 512 UUT nodes; monitoring 4096 nodes with 144 analyzer inputs requires 64 FESN's organized into groups of four FESN's, with a total of 16 DA's employed.

The entire multiplexer subsystem is under control of an external computer 9 which can be a personal computer or engineering workstation. The computer effects subsystem control by communicating with local control microprocessor 163 (FIG. 6) and 173 (FIG. 7) on each of the FESN and DA PCB's. Instrumentation associated with the multiplexer subsystem (such as analyzer 7 in FIG. 1) are also controlled by computer 9.

FESN Architecture

Figure 6:
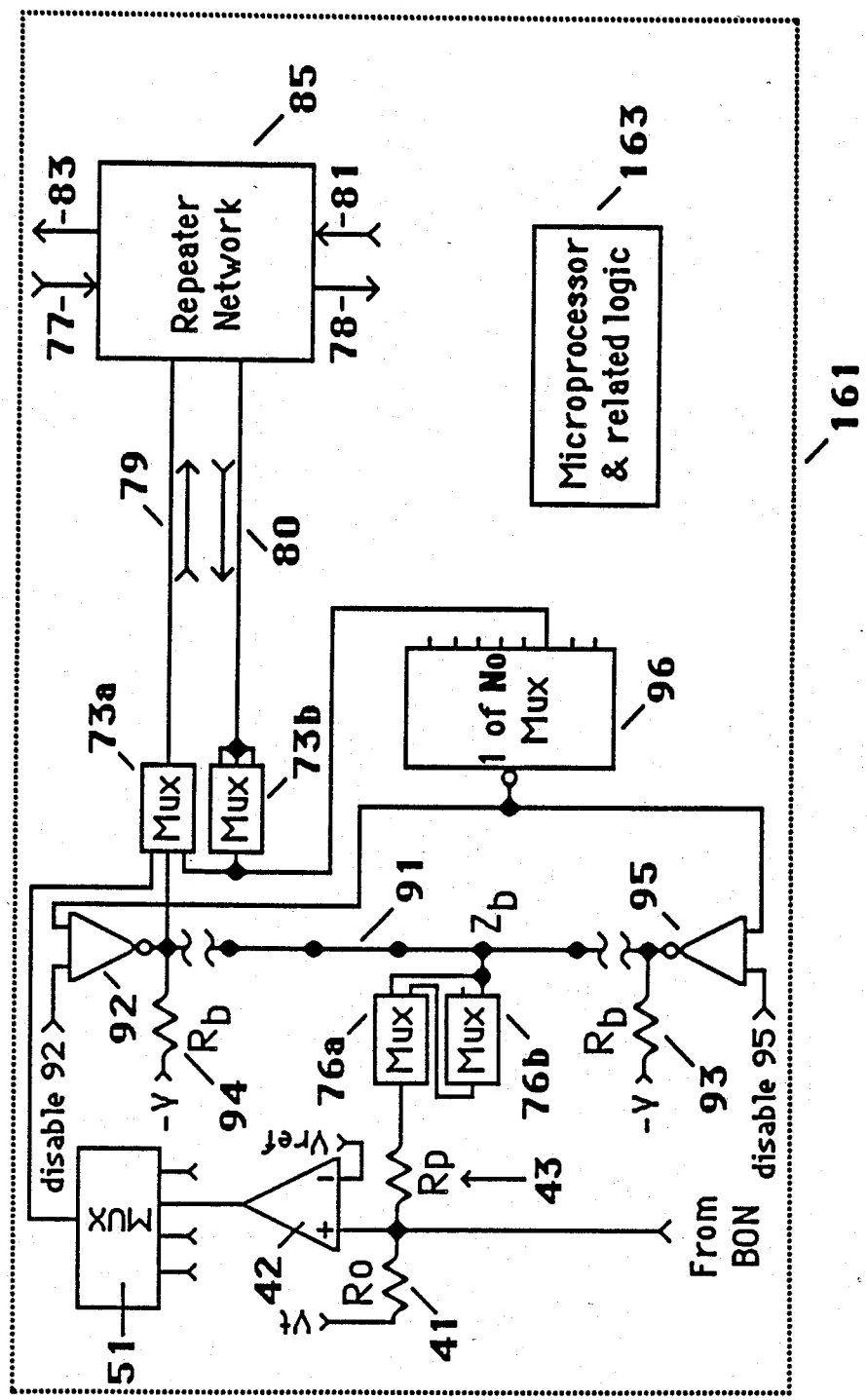
FIG. 6 shows the major signal pathways and circuitry found on the FESN PCB of FIG. 5.

FIG. 6 shows the major signal pathways and circuitry found on the FESN PCB 161. As explained previously, there are $N_i$ inputs, therefore there are $N_i$ comparators (such as 42). Since the FESN PCB produces $N_o$ outputs, there are $N_o$ switching networks, implemented using digital multiplexers such as 51. For each of the $N_o$ outputs, repeater networks (such as 85) are provided; these facilitate signal communication between the FESN's and the DA along the backplane (signals such as 77 and 83 accept in and send out signals to the PCB positioned next to this FESN along the backplane; communication with the PCB plugged in on the other side of the FESN PCB occurs via signals such as 78 and 81).

The remainder of the circuitry shown in FIG. 6 facilitates timing calibration (as explained in *Subsystem Timing Calibration*). A calibration buss 91 is driven by buffer gates 92 and 95; resistors 93 and 94 terminate the buss properly at each end. Gates 92 and 95, which can be type MC10H123 (manufactured by Motorola, Inc., Phoenix, Arizona), are able to drive a double-terminated buss and present a high impedance to the buss when disabled. Gates 92 and 95 are actually several gates connected in parallel, in order to properly drive the relatively low impedance of the buss 91 with its many loads.

Connected to buss 91 are digital multiplexer devices, such as 76a and 76b. Circuit type MC10H158 (manufactured by Motorola, Inc.) which implements four two-input multiplexers can be used. A pair of these multiplexers is associated, as shown, with each input comparator. Connection to the comparator is made via a resistor such as 43.

For each of the $N_o$ outputs and repeater networks, there is one pair of multiplexers, such as 73a and 73b. (In order to keep the loading on buss 91 symmetrical, half the multiplexers such as 73a connect to buss 91 near the output of gates 92; the other half connects to buss 91 near the output of gates 95.) As there is a single calibration buss 91, there is one instance of gates 92 and 95 on the FESN PCB, and also one multiplexer 96. (Multiplexer 96 has an inverting output so that the polarity of the signal on buss 91 is the same as that of the input to 96).

In order that timing calibration be able to be carried out properly, the circuitry of the FESN (FIG. 6) is implemented such that the following is true:

the delay through any of the inputs of multiplexers such as 73a, 73b, 76a and 76b essentially matches that of the other inputs;

the delay through multiplexers such as 73a and 73b are essentially identical;

the delay through multiplexers such as 76a and 76b are essentially identical;

the delay along lines such as 79 is essentially the same as along lines such as 80;

the delay along buss 91 in the direction from 92 to 95 is essentially the same as the delay in the direction from 95 to 92 (this implies the buss is periodically and uniformly loaded);

the electrical distance from buss 91 to the inputs of multiplexers such as 76a and 76b is very short;

the electrical distance from the output of multiplexers such as 76a to the input of comparators such as 42 is very short;

the electrical distance from the output of multiplexers such as 73b to the input of multiplexers such as 73a is very short;

the electrical distance from the output of gates 92 to the input of multiplexers such as 73a is very short (likewise the distance from gates 95 to the inputs of other such multiplexers is very short).

Essentially identical delays along signals lines are achieved by matching the length and width of the lines, and by running them closely together on the same layer of the PCB. Essentially identical delays through active devices are realized by insuring that the devices are fabricated on the same integrated circuit. In some instances, selection of IC's can be performed to insure matching delays of the devices.

Means (microprocessor and related logic) are provided to control the digital (and front end analog) circuitry of the FESN PCB.

DA Architecture

Figure 7:
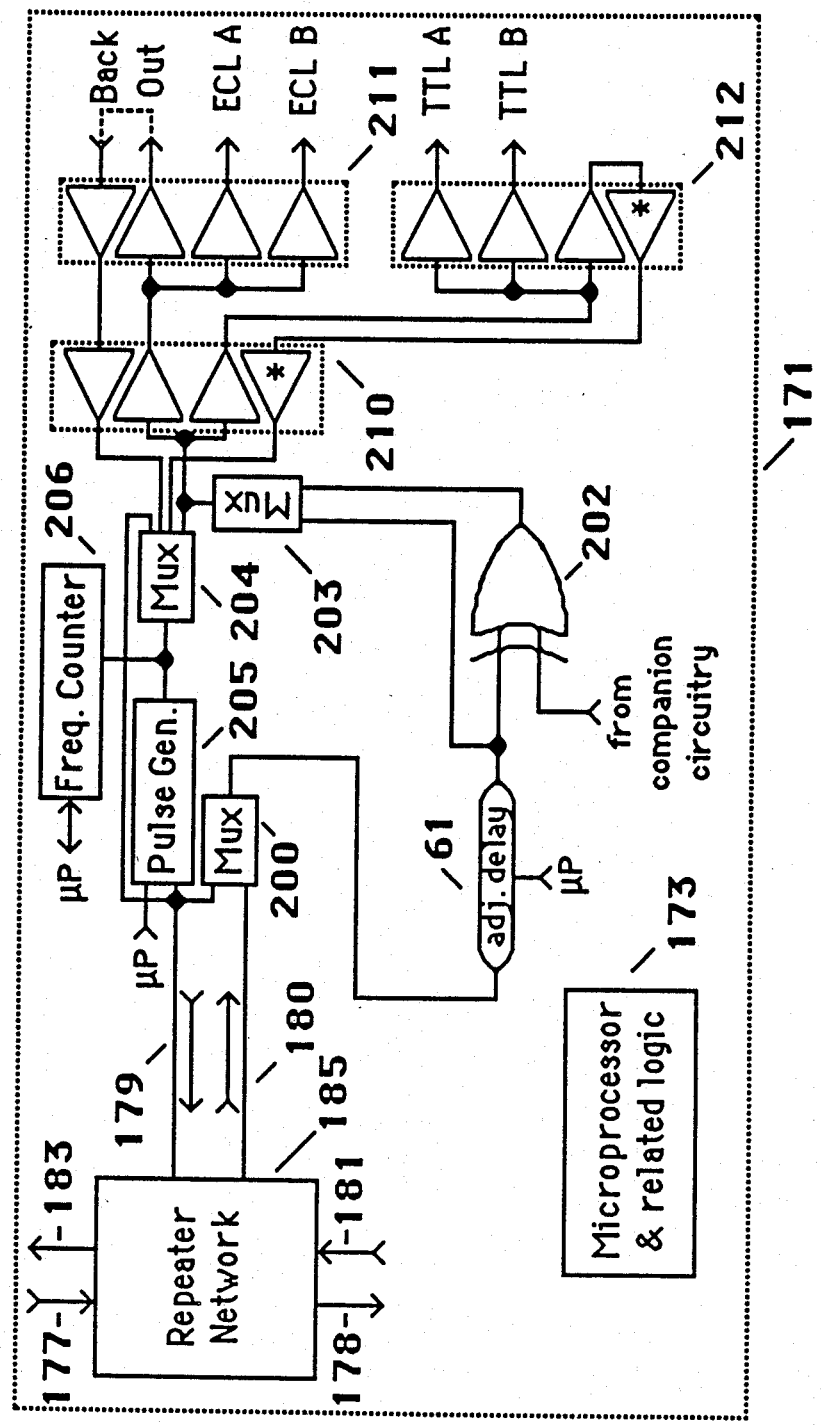
FIG. 7 shows the major signal pathways and circuitry found on the DA PCB of FIG. 5.

FIG. 7 shows the major signal pathways and circuitry found on the DA PCB 171. As explained previously, the DA PCB accepts $N_o$ signals from the FESN's of the group to which it is connected, and produces $N_o$ outputs to which external instrumentation may be attached.

For each of the $N_o$ outputs, repeater networks (such as 185) are present; these facilitate signal communication between the FESN's and the DA along the backplane. Adjustable delays (such as 61) are provided, allowing the skew of each output to be set at a minimum relative to all outputs in the system. For each of the $N_o$ signals, buffers such as 210 and 211 (which can be type MC10H115, manufactured by Motorola, Inc.) and translators such as 212 (which can be type MC10H125, also manufactured by Motorola, Inc.) are used to develop two ECL and two TTL outputs to which external instrumentation (such as analyzer 7 in FIG. 1) may be attached.

Circuitry to perform timing calibration comprises the remainder of the logic shown in FIG. 7, of which the principal elements are a pulse generator (such as 205) and a frequency counter (such as 206).

There are $N_o$ instances of each of the items shown in FIG. 7 (except for items 202 and 203, as explained under *FESN Support For Higher Frequency Signals*).

In order that timing calibration be able to be carried out properly, the circuitry of the DA (FIG. 7) is implemented such that the following is true:

The delay through any of the inputs of multiplexers such as 200 and 204 essentially matches that of the other inputs;

the delay along lines such as 179 is essentially the same as along lines such as 180;

the electrical distance from the output of pulse generators such as 205 to the input of multiplexers such as 200 and 204 is very short;

the electrical distance of the connections between multiplexers such as 204 and buffers such as 210 is essentially identical and/or very short;

the electrical distance of the connections between buffers such as 210 and buffers such as 211 is essentially identical and/or very short;

the electrical distance of the connections between buffers such as 210 and translators such as 212 is essentially identical and/or very short;

the delay through each individual buffer of units such as 210, 211 and 212 essentially matches that of the other devices in that unit.

The same approaches used to insure essentially identical delays of FESN circuitry are used in the case of the DA.

Means (microprocessor and related logic) are provided to control the circuitry of the DA PCB.

Nominal Subsystem Operation

Referring now to FIGS. 6 and 7, the usual signal flow (that is, when timing calibration is not being performed) is as follows.

The UUT signal reaches the "+" input of the comparator (42) on the FESN PCB where it is terminated (by resistor 41) to voltage $V_t$. (The multiplexer 76a is effectively disconnected from affecting the incoming signal, as explained below.) The "−" input of the comparator is set to a reference voltage, $V_{ref}$, as previously explained (refer to *Multiplexer Front End*).

The incoming low level signal is regenerated by the comparator into a standard ECL level signal; one (or none) of many such signals is selected by multiplexer 51. Multiplexer 73a enables the output of 51 to be passed along line 79 to the repeater network circuitry 85.

The signal of interest is passed along the backplane, from repeater to repeater, until it reaches the DA PCB (FIG. 7) and repeater 185. Multiplexer 200 passes the signal through from line 180 to adjustable delay 61; from there it passes through multiplexer 203. The signal is then buffered through 210 and 211 (as well as through 210 and 212) where the output is made available for connection to external instrumentation.

As mentioned above, the output of multiplexers such as 76a (FIG. 6) is effectively disconnected from the comparator (such as 42) during normal operation, as now explained.

All digital logic shown in FIG. 6 is of the ECL family; outputs typically require pulldown resistors to −2 Volts. In most instances, such resistors are not shown explicitly; 93 and 94 in FIG. 6, for instance, are exceptions.

Figure 8:
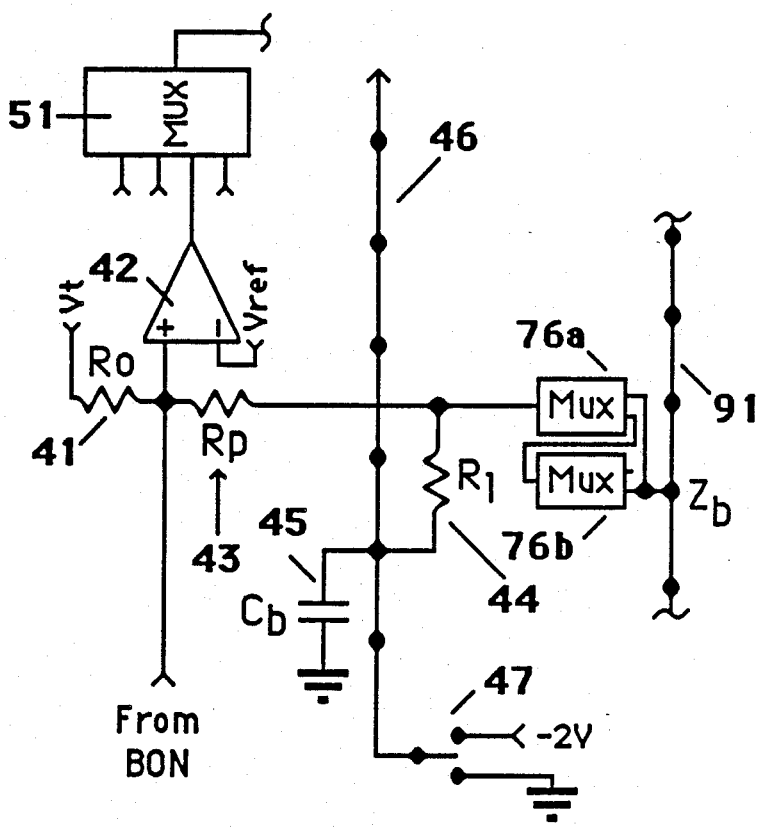
FIG. 8 shows further details relevant to the manner in which circuitry on the FESN PCB of FIG. 6 is implemented.

Likewise, FIG. 8 explicitly shows a load resistor 44 pulling down the output of multiplexer 76a. A special voltage buss 46 is implemented, to which the load resistors at the output of all multiplexers such as 76a are returned. (This voltage buss is separate and distinct from the means of providing −2 Volts pulldown to the other ECL devices on the FESN PCB.) Bypass capacitors such as 45 are present at the site where each resistor connects to the voltage buss.

During normal subsystem operation, switch 47 (which can be a solid-state switch, reed relay or other means) connects the buss to ground. This reverse biases the base-emitter junction of the output transistor of the ECL multiplexer 76a; the output is effectively disconnected with no load being placed on resistors 43 and 44. The UUT signal from the BON is thereby not interferred with as it reaches comparator 42. (Note that the impedances of resistors 43 and 44 do have an effect upon the impedance and voltage level at the "+" input of the comparator; the values of $V_{ref}$ and resistor 41 ($R_0$) are adjusted to compensate for this.)

Proper bypassing of voltage buss 46 (by capacitors such as 45) is critical; low level high frequency input signals from the UUT nodes could otherwise travel through resistors 43 and 44, along buss 46, and be injected at the inputs of other comparators.

When it is desired to effectively connect multiplexers such as 76a in to the comparators (e.g., when it is desired to perform timing calibration), switch 47 is positioned to connect the buss 46 to −2 Volts. This allows the multiplexers to normally develop output signals, which are then coupled through resistors such as 43 into the comparators.

Subsystem Timing Calibration

Determination must be made of the propagation delay from input to output of the subsystem so that the delay means (such as 61) can be adjusted to make the propagation delay of each signal path the same as that of other paths.

Conceptually, it is desired to be able to introduce a pulse at the "+" input of the comparator 42 (FIG. 6), and then perform a point-to-point measurement of the propagation delay from there to an output (such as ECL A, FIG. 7). Rather than such a topologically inconvienent approach, a technique based upon measuring the propagation delay time of a signal around a closed loop is used instead.

The performance of timing calibration (that is, determining the multiplexer subsystem input to DA output delay and adjusting it to a desired value) makes use of pulse generator 205 (FIG. 7). The pulse generator is edge-triggered (rising or falling edge selectable) and outputs either a high pulse (normally low) or a low pulse (normally high).

When the output of the pulse generator is fed back to its input (as by multiplexer 204), an oscillator is formed. The period of oscillation is determined by the delays of all elements along the closed loop path (the delays of the passive signal lines as well as the delays of the active devices (gates)).

Figure 9:
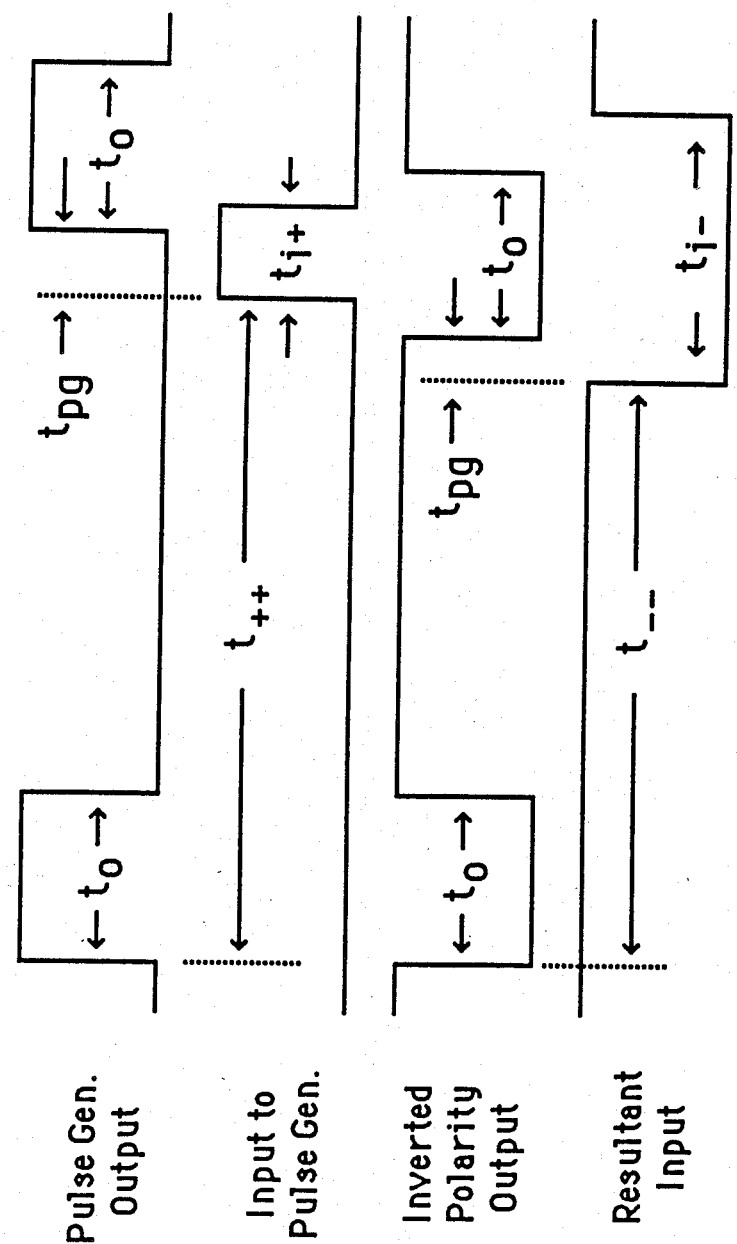
FIG. 9 is a diagram showing the timing relationship between the pulses sent out and those received back in by the timing calibration pulse generator in FIG. 7.

The first two waveforms shown in FIG. 9 depict the typical situation where the rising edge of a signal takes time $t_{++}$, after having been output by the pulse generator, to travel along the loop and arrive back at the input of the pulse generator. (The other two waveforms show the case of falling-edge propagation.) Notice that $t_i$, the width of the returning pulse, is typically not the same as $t_o$, the outgoing pulse width. This is because the propagation delay for a rising-edge signal around a loop $(t_{++})$ is typically not the same as that for a falling-edge signal $(t_{--})$. (Because the pulse generator responds to the incoming edge and not to the width of the incoming pulse, the period of oscillation is unaffected by differences in the values of $t_{++}$ and $t_{--}$).

The measurement technique used is to form a closed loop encompassing a group of circuitry and thereby measure a portion of the overall propagation delay time. Then, a larger loop is formed, encompassing additional circuitry as well as a portion of the smaller loop. The delay of the larger loop is measured and, since the delay of the smaller loop is already known, the delay of the additional circuitry can be mathematically determined. The loop size is thus expanded, step by step, until the propagation delay of the complete path has been determined, from FESN input to DA output.

The first step is carried out by setting multiplexer 204 (FIG. 7) to select the output of pulse generator 205. Frequency counter 206 measures the oscillation period of the signal that results:

$$t_{S1} = t_{205} + t_{204} \qquad [2]$$

In the second step multiplexer 200 is set to select the pulse generator as input. Multiplexer 203 selects the output of delay 61. Multiplexer 204 selects the output of multiplexer 203. Frequency counter 206 measures the oscillation period:

$$t_{S2} = t_{205} + t_{200} + t_{61} + t_{203} + t_{204} \qquad [3]$$

$$= t_{S1} + t_{200} + t_{61} + t_{203} \qquad [4]$$

By defining $$t_A = t_{200} + t_{61} + t_{203} \qquad [5]$$

we have $$t_A = t_{S2} - t_{S1} \qquad [6]$$

In other words, the propagation delay from the input of multiplexer 200 to the output of multiplexer 203 is now known, even though it hasn't been measured directly.

In the third step, the output of the pulse generator is sent by repeater network 185 down the backplane to the repeater network (85, FIG. 6) on the FESN where the input of interest is located. All repeater networks on PCB's which reside in-between the DA and the FESN of interest are directed simply to pass the signal along the backplane.

At the FESN of interest, the signal from the backplane is accepted in by multiplexer 73b (FIG. 6). Multiplexer 73a is set to select the output of 73b and the signal is sent back, through the series of repeater networks, along the backplane to the DA PCB. There (FIG. 7), multiplexer 200, 203 and 204 are set as they were in step two, recirculating the signal back to the pulse generator.

Therefore, for the third step we have $$t_{S3} = t_{179} + t_{net-outbound} + t_{80} + t_{73b} + t_{73a} + t_{79} + t_{net-inbound} + t_{180} + t_{S2} \qquad [7]$$

where $t_{179}$ represents the delay along line 179 (FIG. 7) from the output of pulse generator 205 to the circuitry of the repeater network 185; $t_{net-outbound}$ represents the delay through all repeater networks from and including repeater network 185 of the DA, through to and including the repeater network circuitry 85 (FIG. 6) on the FESN of interest; $t_{80}$ represents the delay along line 80 (FIG. 6) from repeater network 85 to the input of multiplexer 73b; $t_{73b}$ represents the delay through multiplexer 73b; $t_{73a}$ represents the delay through multiplexer 73a; $t_{79}$ represents the delay along line 79 from the output of multiplexer 73a to the circuitry of repeater network 85; $t_{net-inbound}$ represents the delay through all repeater networks from and including repeater network circuitry 85 on the FESN of interest through to and including the repeater network 185 on the DA (FIG. 7); and $t_{180}$ represents the delay along line 180 (FIG. 7) from the repeater network 185 to the input of multiplexer 200.

As already discussed, the delays of lines 179 and 180 (FIG. 7) are essentially identical; likewise with the delays of lines 79 and 80 (FIG. 6). Furthermore, the implementation of the repeater network circuitry is mirror-symmetric such that the delay of a signal traveling through a series of repeater networks in one direction is essentially the same as the delay of a signal traveling in the opposite direction (this is discussed more fully in *Repeater Network Circuitry Implementation*).

Therefore, by defining $$t_B = t_{73a} + t_{79} + t_{net-inbound} + t_{180} = t_{73b} + t_{80} + t_{net-outbound} + t_{179} \qquad [8]$$

we have $$t_B = (t_{S3} - t_{S2})/2 \quad [9]$$

At this point, the delay from the input of multiplexer 73a through to the output of multiplexer 203 is known; it equals $$t_A + t_B \quad [10]$$

In the fourth step the overhead of the calibration buss-related circuitry is determined. Multiplexer 73a (FIG. 6) is set to take its input from the calibration buss, and gates 92 are enabled. Multiplexer 96 selects the output of multiplexer 73b; that is, it selects the appropriate set of output circuitry from among the $N_o$ present on the FESN. Otherwise, everthing is left the same as in step three.

The period of oscillation will be:

$$t_{S4} = t_{S3} + t_{96} + t_{92} \quad [11]$$

where $t_{96}$ represents the delay of multiplexer 96 plus the delay along the line from the output of 73b to the input of 96, and $t_{92}$ represents the delay of gates 92 as well as the delay along the line from the output of 96 to the input of 92.

In the fifth step, all is the same as in the fourth step except that gates 92 are disabled and gates 95 are enabled:

$$t_{S5} = t_{S3} + t_{96} + t_{95} + t_{91} \quad [12]$$

where $t_{95}$ represents the delay of gates 95 as well as the delay along the line from the output of 96 to the input of 95, and $t_{91}$ represents the delay along buss 91.

In the sixth step, all is the same is in the *fourth* step except that multiplexer 73a selects the output of multiplexer 51. Multiplexer 76a selects buss 91. The UUT is absent from the BON when timing calibration is performed and buss 46 (FIG. 8) carries −2 Volts to enable the outputs of multiplexers such as 76a. This result is obtained:

$$t_{S6} = t_{S4} + t_{91'} + t_{76a} + t_{42} + t_{51} \quad [13]$$

where $t_{91'}$ represents the delay along buss 91 from the output of gates 92 to the input of multiplexer 76a, $t_{42}$ represents the delay through comparator 42 plus the delay along the line to multiplexer 51, and $t_{51}$ represents the delay through multiplexer 51 plus the delay along the line to multiplexer 73a. Multiplexer 51 selects the particular input of the FESN for which the propagation delay (FESN input to DA output) is to be determined.

By defining $$t_C = t_{42} + t_{51} \quad [14]$$

we have $$t_{S6} = t_{S4} + t_{91'} + t_{76a} + t_C \quad [15]$$

In the seventh step, all is the same as in the sixth step, except that gates 92 are disabled and gates 95 are enabled:

$$t_{S7} = (t_{S5} - t_{91}) + t_{91''} + t_{76a} + t_C \quad [16]$$

where $t_{91''}$ represents the delay along buss 91 from the output of gates 95 to the input of multiplexer 76a.

By defining $$t_D = t_{S6} + t_{S7} \quad [17]$$

we have $$t_D = t_{S4} + t_{S5} - t_{91} + (t_{91'} + t_{91''}) + 2t_{76a} + 2t_C \quad [18]$$

and therefore $$t_D = t_{S4} + t_{S5} + 2t_{76a} + 2t_C \quad [19]$$

and hence $$t_C = ((t_D - t_{S4} - t_{S5})/2) - t_{76a} \quad [20]$$

Note that the values of $t_{S6}$ and $t_{S7}$ depend upon input is being calibrated (that is, upon the distance of 76a from either end of buss 91), whereas $t_D$ does not. Hence 91 is referred to as the calibration buss; its use allows calibration signals to be delivered to the $N_i$ inputs on the FESN with a result that is unaffected by the physical placement of the input circuitry around the PCB.

In the eight step, the value of $t_{76a}$ is determined by keeping all the same as for the seventh step, except that multiplexer 76a selects the output of 76b:

$$t_{S8} = t_{S7} + t_{76b} \quad [21]$$

therefore $$t_{76a} = t_{S8} - t_{S7} \quad [22]$$

Now, the delay from the input of the comparator through to the output of multiplexer 203 is given by:

$$t_E = t_C + t_B + t_A \quad [23]$$

$$= (((t_D - t_{S4} - t_{S5})/2) - t_{76a}) + ((t_{S3} - t_{S2})/2) + (t_{S2} - t_{S1}) \quad [24]$$

$$= ((((t_{S6} + t_{S7}) - t_{S4} - t_{S5})/2) - (t_{S8} - t_{S7})) + ((t_{S3} - t_{S2})/2) + (t_{S2} - t_{S1}) \quad [25]$$

$$= (-2t_{S8} + 3t_{S7} + t_{S6} - t_{S5} - t_{S4} + t_{S3} + t_{S2} - 2t_{S1})/2 \quad [26]$$

In the ninth step, the delay from the output of multiplexer 203 to the external instrumentation connection point is determined. All is the same as in the *second* step, except multiplexer 204 selects as input the circuitry associated with either the buffers providing the ECL outputs or those providing the TTL outputs. (This choice depends upon which outputs, ECL or TTL, are to be calibrated.)

With the choice of calibrating the ECL outputs, assume that "Out" is jumpered to "Back" (FIG. 7). The result is:

$$t_{S9} = t_{S2} + 2(t_{210} + t_{211}) \quad [27]$$

By defining $$t_F = t_{210} + t_{211} \quad [28]$$

we have $$t_F = (t_{S9} - t_{S2})/2 \quad [29]$$

Therefore, the total delay from comparator input to ECL output is given by:

$$t_G = t_E + t_F \quad [30]$$

$$=(t_{S9}-2t_{S8}+3t_{S7}+t_{S6}-t_{S5}-t_{S4}+t_{S3}-2t_{S1})/2 \quad [31]$$

Figure 10:
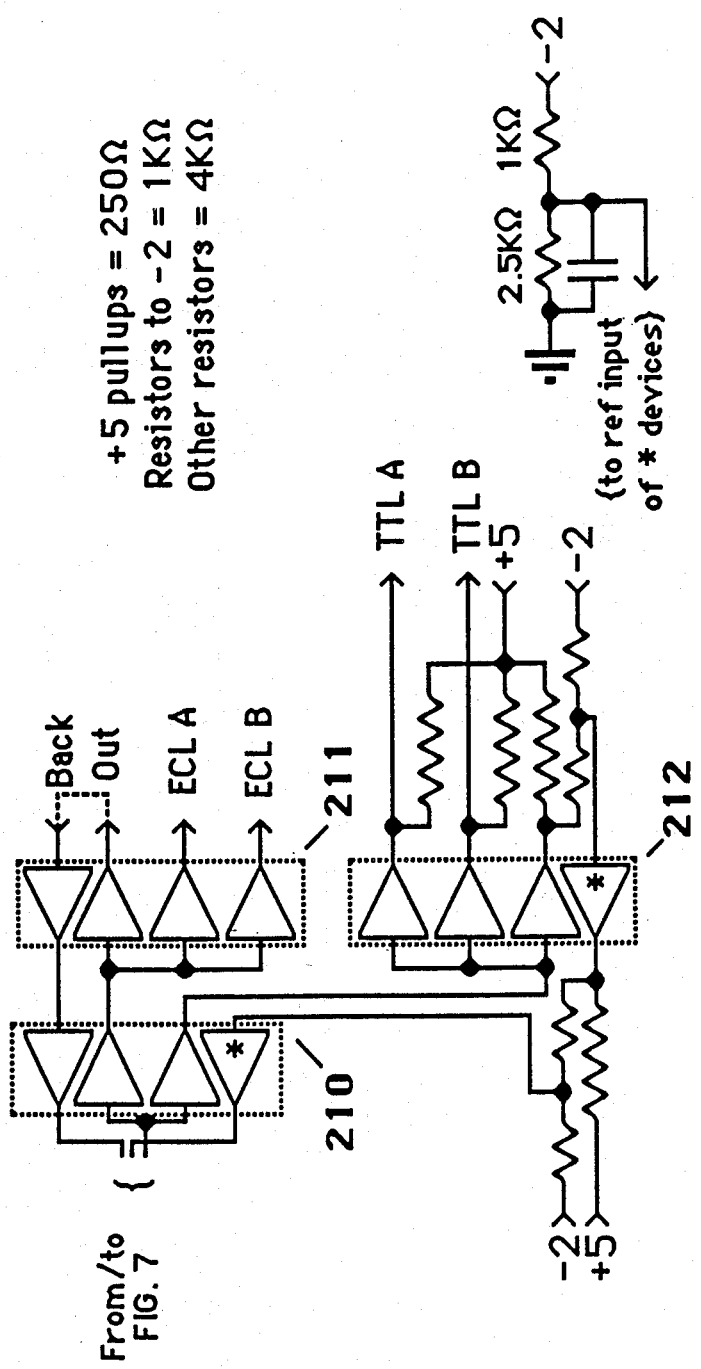
FIG. 10 shows details of circuitry associated with the TTL output translators on the DA PCB of FIG. 7.

Determining the input to TTL output propagation delay is done in a similar manner, except that multiplexer 204 selects the other (fourth) buffer's output from 210. FIG. 10 shows details of circuitry associated with the TTL translator buffers 212. Essentially, to obtain a mirror-image delay to the TTL output and back again for timing calibration purposes, the signal is made to travel through two translators. Unlike the case of buffers 211 where the input and output levels are compatible (both ECL), the situation here is complicated by the fact that the translators accept ECL levels at their inputs but output TTL levels. The outputs of the translators are resistively divided and level shifted to obtain an ECL-like signal acceptable to the differential inputs of the translator (the fourth device (*) of 212) as well as the buffer (the fourth device (*) of 210, FIG. 7).

In FIG. 7, Out-Back jumpering is used when off-the-shelf external instrumentation is connected to ECL A and/or ECL B. However, provision is also made for connection of special-purpose instrumentation, in which case Out is not jumpered to Back. Such instrumentation, not shown in FIG. 7, may be specifically designed to accept the Out signal, provide a mirror-symmetric Out/Back path delay and return a signal to Back. In this way the timing calibration sequence can be extended also to incorporate circuitry located within the special-purpose instrumentation, so that the overall delay from comparator input to such circuitry may be determined.

Once the overall propagation delay (equation 31) has been determined, the adjustable delay 61 may be set so as to achieve whatever propagation delay is desired. (Refer to *Adjustable Delay Implementation* for details on how delay 61 can be realized.) The process is typically iterative in nature; a change is made to the delay setting, followed by a determination of the overall delay, followed by another delay change, and so forth. Note that in such an iterative process, all the steps outlined need not be repeated; in fact, performing just step two iteratively is sufficient. In other words, the adjustable delay is kept fixed when the calibration steps are carried out. Then, knowing the overall delay desired and what the delay has been determined to be with 61 set as it is, gives the value by which delay 61 must be increased (or decreased). Noting what $t_{S2}$ had been measured to be, the delay 61 is changed until $t_{S2}$ has changed by the requisite amount (indicating thereby that delay 61 has changed by that amount).

The entire timing calibration procedure is carried out twice; once with the pulse generator 205 triggering on the rising edge of the incoming signal and producing a normally-low output, and a second time with the pulse generator triggering on the falling edge of the incoming signal and producing a normally-high output. Adjustable delay 61 is implemented such that the rising-edge input to rising-edge output delay is adjustable independently of the falling-edge input to falling-edge output delay.

Fixture Cabling Timing Calibration

The above timing calibration discussion disregarded the fact that the input signal line to the comparator 42 ("From BON", FIG. 6) is of significant electrical length.

Figure 11:
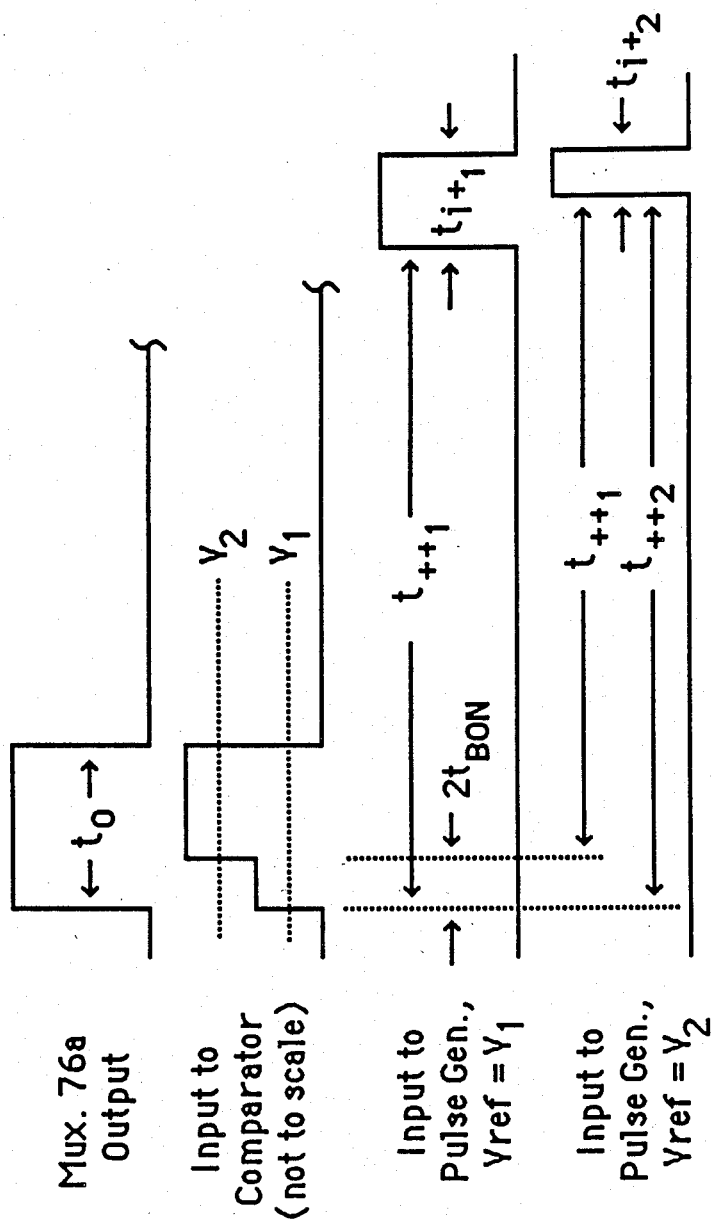
FIG. 11 is a diagram showing the timing of signals relevant to determining the propagation delay of the cabling connecting the UUT from the BON to the multiplexer subsystem in FIG. 6.

FIG. 11 shows the output of multiplexer 76a as a pulse of width $t_0$ (as would occur during the calibration procedure). The signal at the input of the comparator is seen to have a step in it; this is due to the presence of the signal line from the BON.

Because the impedance of the terminating resistor 41 ($R_0$) is essentially the same as the impedance of the line, the initial signal level at the comparator is only one-half of its eventual amplitude. Only after the signal has traveled the length of the line, been reflected due to the high impedance at the end (no UUT is present during timing calibration) and has returned, is the voltage stable at the input of the comparator.

To circumvent this effect, the reference voltage at the "−" input of the comparator may be set to $V_1$ as shown in FIG. 11, approximately one-quarter the eventual signal amplitude. After a time $t_{++1}$ (FIG. 11), the pulse generator receives the signal after it has traversed the calibration loop (steps #6, 7 and 8).

However, by setting the "−" input of the comparator to a value $V_2$ (as shown in FIG. 11, approximately three-quarters of the eventual signal amplitude), the time the signal takes to propagate down to the BON and return ($2t_{BON}$) becomes included in the overall propagation delay time.

Therefore, the previously outlined calibration steps are carried out with $V_{ref}$ set at $V_1$; a tenth step is then carried out by performing a delay measurement such as $t_{S6}$ (or $t_{S7}$ or $t_{S8}$) with $V_{ref}$ set to $V_2$. Thus:

$$t_{S10}=t_{S6}+2t_{BON} \quad [32]$$

and $$t_{BON}=(t_{S10}-t_{S6})/2 \quad [33]$$

Hence, finally, the complete multiplexer subsystem propagation delay from chosen BON probe tip to chosen DA output is given by:

$$t_H=t_G+t_{BON} \quad [34]$$

$$=(t_{S10}+t_{S9}-2t_{S8}+3t_{S7}-t_{S5}-t_{S4}+t_{S3}-2t_{S1})/2 \quad [35]$$

Front End Circuitry Implementation

The input signal from the BON connects to the "+" input of comparator 42 (FIG. 12) where it is pulled up to voltage $V_t$ through terminating resistor 41 ($R_0$). Connection to timing calibration multiplexer 76a is made via resistor 43 ($R_p$).

Figure 12:
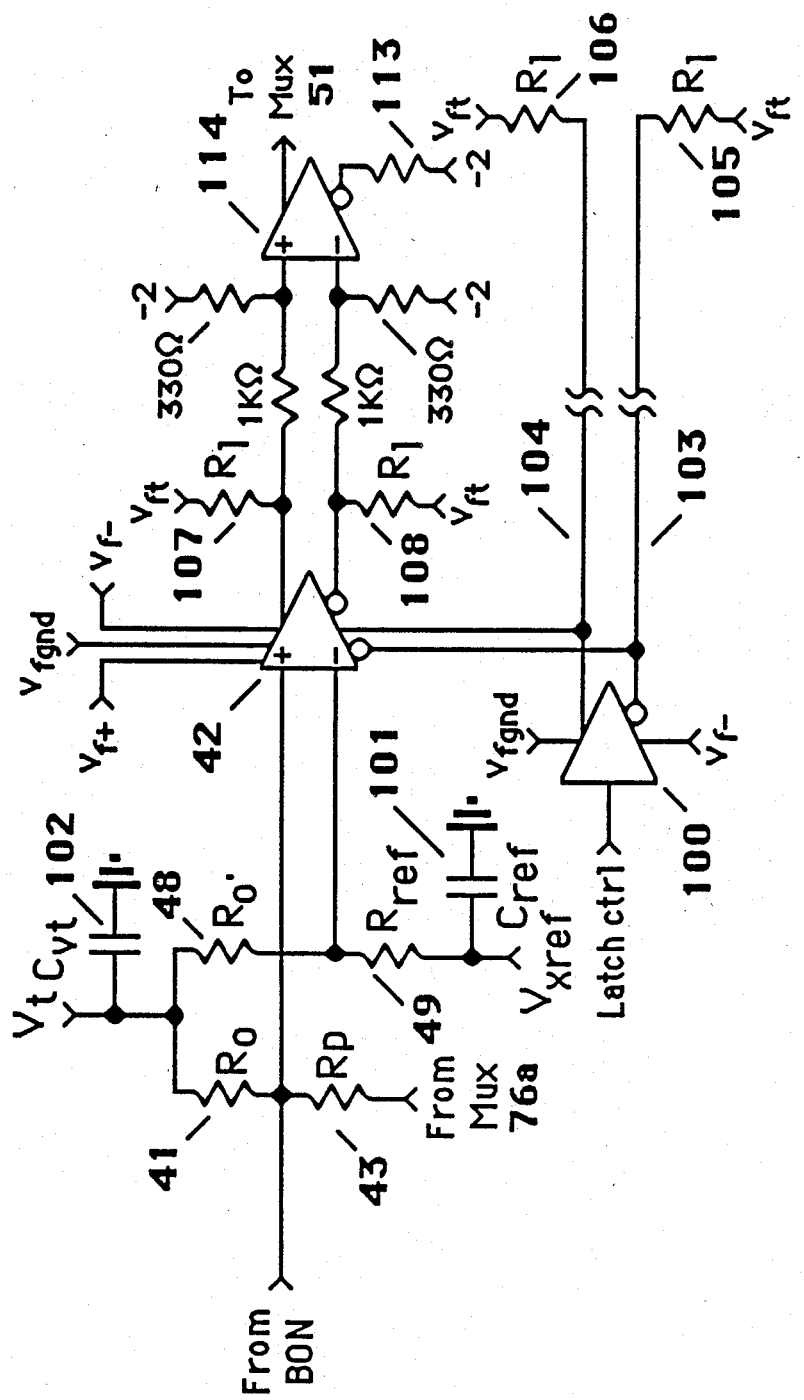
FIG. 12 shows details of the front end circuitry associated with the input comparators on the FESN PCB of FIG. 6.

The comparator reference voltage $V_{ref}$ (see FIG. 6) is actually derived as shown in FIG. 12 by a resistive divider of resistor 49 ($R_{ref}$) and resistor 48 ($R_{0'}$). $R_{0'}$ is returned to pullup voltage $V_t$ just as $R_0$ is. By the proper setting of $V_{xref}$ an appropriate reference voltage at the "−" input of the comparator is obtained. The advantage of using a resistive divider is that any noise and error signals present on $V_{xref}$ are attenuated significantly; the impedance levels at both inputs of the comparator are also approximately the same ($R_{0'} \approx R_0$).

All resistors connected to either input of the comparator are locally bypassed with capacitors (such as 102 ($C_{vt}$), 101 ($C_{ref}$) and 45 ($C_b$, FIG. 8)) to insure a proper high frequency path to ground. The electrical distance of the components from the inputs of the comparator is kept very short.

The comparator 42 can be type AD9687BD dual comparator IC (manufactured by Analog Devices, Inc., Norwood, Massachusetts). In order to accomodate a wider range of common mode ($V_t$) voltage than the comparator inherently tolerates, the supply voltages (nominally +5 Volts, 0 Volts and −5.2 Volts) are derived from controllable voltage sources ($V_{f+}$, $V_{fgnd}$, $V_{f-}$) which float (i.e., are at an offset voltage) relative to system ground. In a like manner, the ECL output pulldown voltage (nominally −2 Volts) is $V_{ft}$. In FIG. 12, $V_{f+}$ is 5 Volts above $V_{fgnd}$; $V_{f-}$ is 5.2 Volts below $V_{fgnd}$; $V_{ft}$ is 2 Volts below $V_{fgnd}$.

The inputs of the FESN ("From BON" in FIG. 12), along with their associated front end circuitry, are gathered together into "input groups" of $N_g$ members ($N_g=8$ in one preferred implementation). All members of an input group share a common source of $V_t$, $V_{f+}$, $V_{fgnd}$, $V_{f-}$ and $V_{ft}$; this is done for reasons of economy. (Such input groups are not to be confused with the groupings of FESN PCB's diagrammed in FIG. 5.)

Except when $V_{fgnd}$ is set to 0 Volts (relative to system ground), the ECL outputs of the comparators in the group (such as 42) will be at an offset above or below ground. For example, to accomodate a pullup voltage of +5 Volts ($V_t$), which is 2.5 Volts above the nominal input range of the comparator, $V_{fgnd}$ could be set to +3 Volts; the ECL outputs would then be shifted upward in voltage by that amount.

Differential receiver 114 (which can be type MC10H116, manufactured by Motorola, Inc.) is used in conjunction with a voltage divider network at each input, to regenerate a ground-referenced ECL signal. The division ratio is chosen to allow the outputs of comparator 42 to be shifted (float) upward or downward as far as required without violating the input voltage range limitations of the differential receiver; however, the division ratio cannot be made too large else the signal amplitude into the receiver will be insufficient to guarantee proper operation. Using approximately a 1:4 division ratio allows a compromise, with a $V_t$ range of at least from −5.5 Volts to +5.5 Volts.

FIG. 12 shows that ECL buffer 100 buffers a latch control signal (which is used to facilitate analog voltage measurements of the UUT signal, as explained in *Support For Analog Measurements*). True and complementary signals (104 and 103) are supplied to all the comparators in a given input group by a single buffer. In order to drive into the comparators' inputs, the buffer's supply lines and outputs are floated relative to $V_{fgnd}$ (as also the latch control input signal itself is). The electrical distance between lines 103 and 104 and the comparators' inputs is kept very short, and resistors 105 and 106 terminate the lines to $V_{ft}$.

Figure 13:
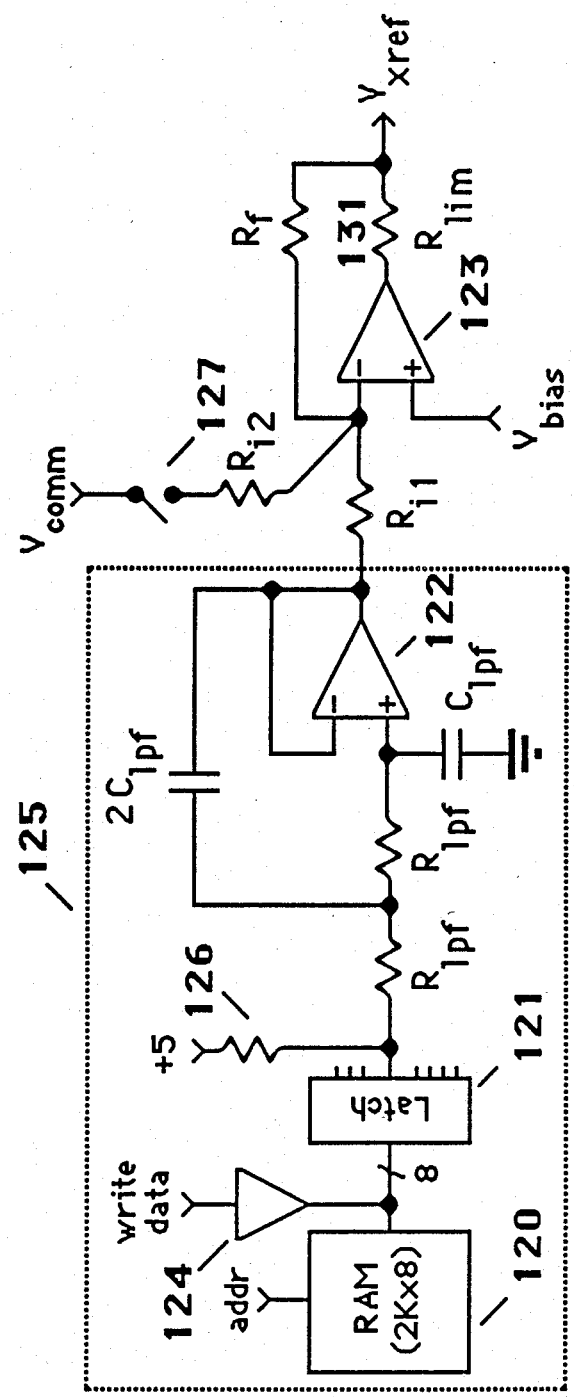
FIG. 13 shows details of additional circuitry associated with the front end circuitry of FIG. 12.

While all comparators in a group share one $V_t$ source, it is advantageous to provide individual $V_{xref}$ signals to each comparator; this facilitates adjustment to compensate for the input offset voltage of the comparator, and also allows any particular input's digital threshold to be set desired. In FIG. 13 circuitry 125 produces an adjustable voltage which when buffered by operational amplifier (op amp) 123 becomes the $V_{xref}$ signal of FIG. 12. The non-inverting input of the op amp connects to a voltage $V_{bias}$ which is the midpoint voltage of the output of circuit 125 as well as signal $V_{comm}$ ($V_{bias}$ is used to enable the op amp to produce a bi-polar output signal even though its inputs are uni-polar). $V_{comm}$ facilitates analog voltage measurements (see *Support For Analog Measurements*); when analog switch 127 is closed, op amp 123 adds the value of $V_{comm}$ in with the adjustable voltage from circuit 125 in producing $V_{xref}$. Because $V_{xref}$ is bypassed to ground (FIG. 12), resistor 131 ($Rh_{lim}$) buffers the output of the op amp. There is one set of op amp circuitry (123 and related components) for each comparator 42 (FIG. 12). Analog switch 127 is one-eight of an eight input analog multiplexer, allowing up to one op amp (123) in the group to connect to $V_{comm}$.

The source of the voltage input to op amp 123 through resistor $R_{i1}$ could be a conventional digital to analog converter (DAC). An alternative is the circuitry labelled 125 in FIG. 13. This circuitry is intended to implement the equivalent of a DAC function, but at a lower cost. The essential feature of circuit 125, which may be called a memory-implemented DAC (memDAC), is the use of inexpensive random access memory (RAM) to produce a periodic control waveform which is low-pass filtered to derive a DC control voltage.

At system initialization time, the RAM 120 is loaded with data which will produce control waveforms with the desired duty cycle values. In operation, RAM 120 continuously reads through all memory locations to generate and output the stored waveforms. Latch 121 holds the result of each datum read. Pullup resistors 126 insure a +5 Volt TTL high level is obtained for input to the low-pass filter. Any of a number of active filter op amp-based designs may be used for the filter; one approach is shown in FIG. 13 with passive components $R_{lpf}$, $C_{lpf}$, $2C_{lpf}$ as well as op amp 122 implementing the filter.

The low pass filter cutoff is chosen to provide adequate attenuation of the high frequency components present in the digital input signal. For example, if RAM 120 has a 100 nanosecond cycle time, all 2048 addresses are cycled through in 204.8 microseconds. The frequency of the digital signal applied to the filter is thus approximately 5 KHz. With a second-order filter, a cutoff frquency of approximately 50 Hz will result in attenuation of all frequency components (beyond DC) by more than a factor of 10,000. This will allow the desired resolution of one part in 2048 to be achieved.

Latch 121 insures that the low pass filter is fed a steady signal even when the RAM is in the middle of performing its reads (during which time its output lines could be unstable). Three-state buffer 124 is used to update the control pattern information in the RAM when a different duty cycle (and therefore output control voltage) is desired. When the address of interest has cycled around and is present on the RAM address inputs, RAM control signals cause a write cycle to occur with write information provided via the buffer.

The circuits of RAM 120, latch 121, buffer 124 and pullups 126 are packaged eight to a package (and op amps 122 and 123 four to a package), so the per-output cost is low with this approach. For each group of comparators, one each of devices 120, 121, 124, 126 and 127 (two each of 122 and 123) suffices to produce eight individual $V_{xref}$ signals. There is one common set of logic on the FESN which produces the RAM address, write data and control signals to which all input groups' RAM's are connected. This logic operates under control of the FESN microprocessor 163 (FIG. 6).

Switching Network Implementation

For each of the $N_o$ outputs of the FESN, multiplexer 51 (FIG. 1 and FIG. 6) selects which, if any, of the FESN inputs is to be passed out to the DA of that group (FIG. 5) via the repeater networks over the backplane. The $N_i$ input to single output multiplexing function is realized through the use of conventional eight-input multiplexers (which can be type MC10H164, manufactured by Motorola, Inc.) with the outputs combined together (using OR gates) into a single signal.

Note that there is no requirement that all paths through the circuitry of the switching network be identical in any way. Neither is there any requirement that the delay characteristics of the input comparators match one other. The calibration technique of the preferred embodiment effectively compensates for any such differences.

FESN Support For Higher Frequency Signals

Information may be passed from the UUT to external instrumentation at a data rate up to that determined by the bandwidth limitations of the multiplexer subsystem. In order to allow the test instrumentation (such as analyzer 7, FIG. 1) to synchronously process high data rate signals, it is desireable to provide at least a few multiplexer subsystem inputs which can handle signals with higher bandwidths. Such inputs could be used to carry clock information, the bandwidth of which is typically at least twice that of the associated data signals.

The approach taken is to use two nominal-bandwidth FESN input to DA output connections to realize a single, higher bandwidth connection. One of the input groups of the FESN has a pair of flipflops associated with each of the differential receivers for that group (refer to FIG. 14). One of the flipflops (such as 142) toggles on the rising edge of the output of receiver 114, while the other (such as 141) toggles on the falling edge. The outputs of the flipflops are made available to the switching network multiplexers (such as 51) on the FESN (along with the signal from receiver 114 itself). The comparators 42 used in the group are wider bandwidth units, such as type SP93802 (manufactured by Plessey Semiconductors, Ltd., Swindon, England).

Typically, one of the $N_o$ outputs of the FESN will carry the signal from one of the flipflops of a pair, while its neighboring output will carry the signal from the other flipflop of the pair. The two signals are passed to the DA, where the first is processed by circuitry as shown in FIG. 7. Another set of DA logic, processing the second signal ("companion circuitry"), is implemented similarly to that shown in FIG. 7 except that exclusive-OR (XOR) gate 202 and multiplexer 203 are not present. Instead the output of delay 61 of the companion DA circuitry is fed directly to multiplexer 204 and buffers 210. The output from delay 61 of the "companion circuitry" (not shown) is accepted in by the XOR gate 202 of the first set of circuitry shown in FIG. 7. The XOR gate reconstitutes the original signal from the two lower frequency signals.

Figure 14:
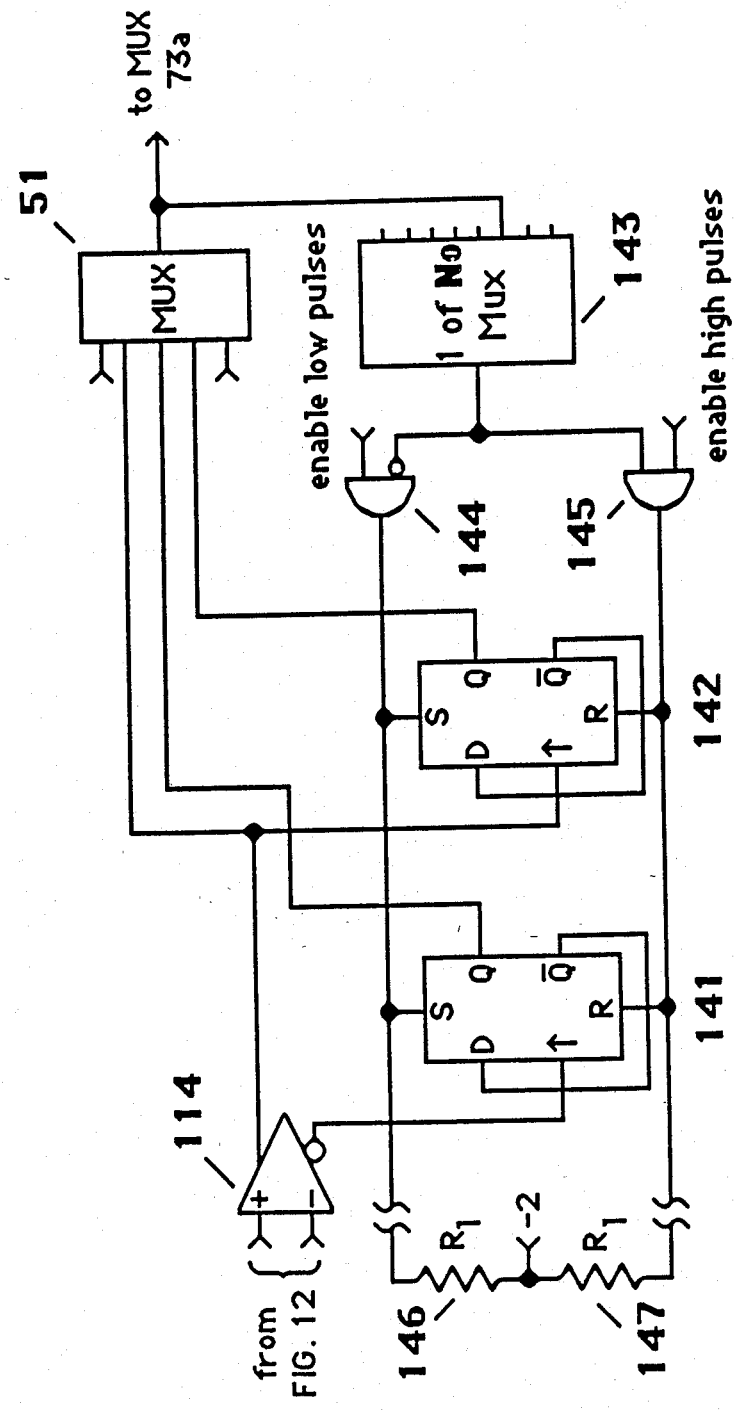
FIG. 14 shows details of signal frequency-reduction circuitry in the front end section of the FESN PCB as shown in FIG. 12.
Figure 15:
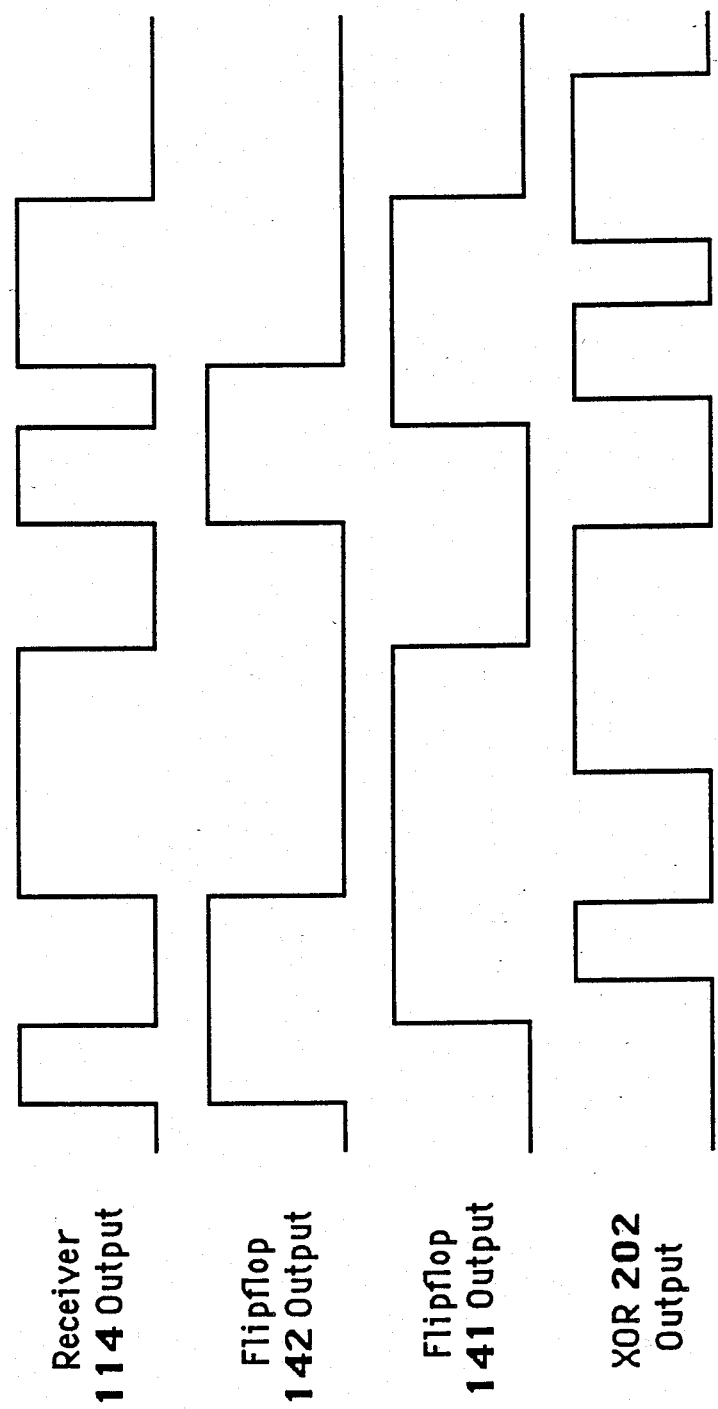
FIG. 15 is a diagram showing the timing relationships of signals during nominal operation of frequency-reduction circuitry of FIG. 14 and of the DA PCB circuitry of FIG. 7.

FIG. 15 illustrates what happens during normal operation of the circuitry. The incoming signal is present at the output of receiver 114 (FIG. 14); each rising edge toggles flipflop 142, and each falling edge toggles flipflop 141. These signals are sent out over separate paths to the DA (FIG. 7) where XOR gate 202 of the first path circuitry receives them in. The reconstituted signal is shown in the "XOR 202 Output" timing line of FIG. 15. (Note, as shown, the relative delay due to the time taken for the signals to travel from flipflops 141 and 142 to the DA circuitry.)

Figure 16:
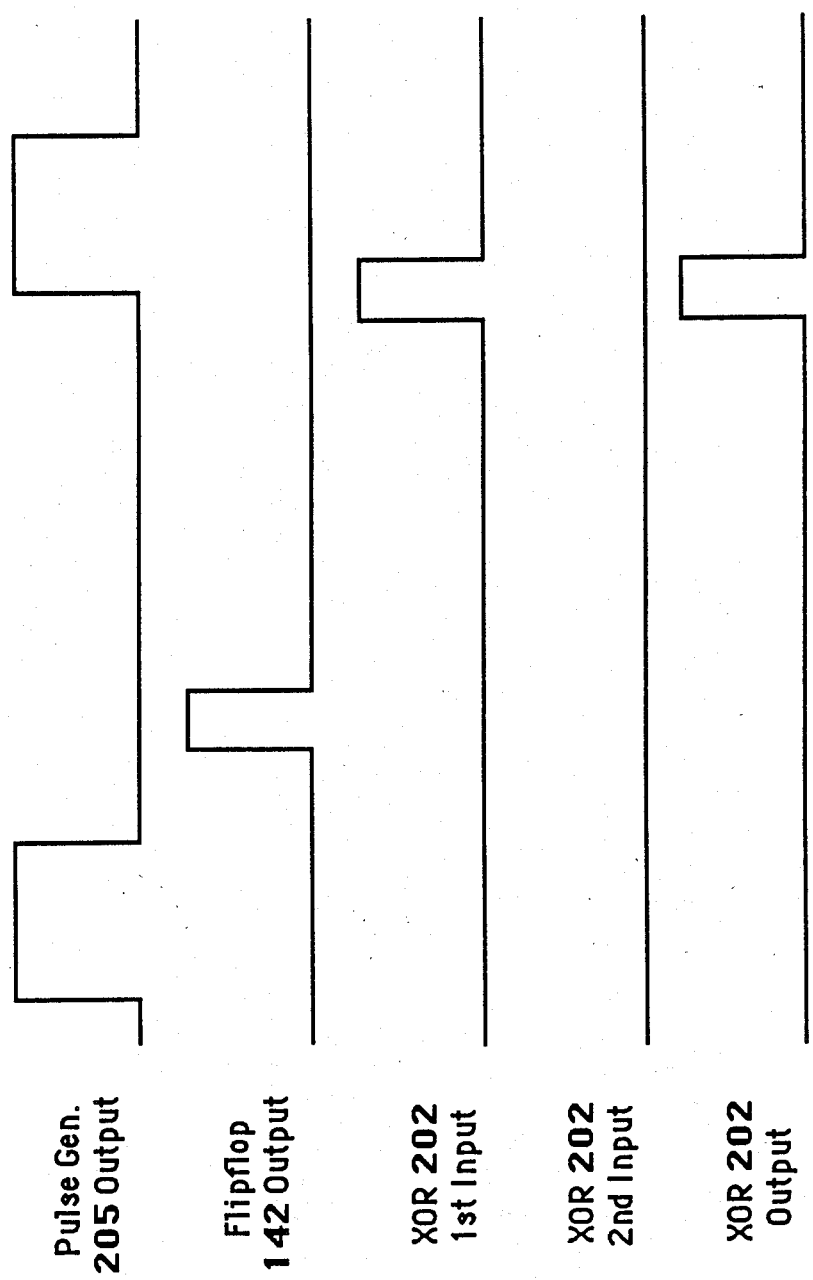
FIG. 16 is a diagram showing the timing relationships of signals from the pulse generator and exclusive-OR gate of FIG. 7, and the frequency-reduction flipflops of FIG. 14, during first path rising-edge timing calibration.

Timing calibration is performed on both signal paths, first one and then the other. Calibration of the first path is carried out as previously described, with the input to XOR gate 202 ("from companion circuitry") first being low (refer to FIG. 16). Pulse generator 205 is set to output a high (normally low) pulse which clocks rising-edge triggered flipflop 142. Circuitry on the FESN (multiplexer 143 and gate 145; refer to FIG. 14), enabled during timing calibration, causes the flipflop to be reset shortly after it enters the on state; a high-going pulse is produced. Pulse generator 205, set to trigger on the rising edge of the returning signal, will then start another oscillation cycle.

Falling-edge calibration of the first path is carried out in a similar manner, with the "companion circuitry" input to XOR gate 202 now high. Pulse generator 205 outputs a high-going (normally low) pulse, which clocks flipflop 142. In this instance, the flipflop pulse generation circuitry (multiplexer 143 and gate 144; refer to FIG. 14) causes the flipflop to be set as soon as it gets clocked off; a low-going (normally high) pulse is produced by the flipflop. Pulse generator 205, still set to trigger on the rising edge of the incoming signal, will then start another oscillation cycle when the pulse (after having been inverted by XOR gate 202) arrives back at pulse generator 205.

Rising- and falling-edge timing calibration of the second path is carried out similarly to that described above for the first of the two paths. Since XOR gate 202 of the first path reconstitutes the signal, the timing calibration circuitry of the first path (devices 204, 205, 206) is used in calibrating the second path. Signals from pulse generator 205 of the first path travel to the FESN where they are presented to the front end circuitry, as before. Circuitry there (multiplexer 51 of FIGS. 14 and 6) selects the output of the falling-edge triggered flipflop (141), which is sent back to the DA via the second path. It is made available (as signal "from companion circuitry") to XOR gate 202 of the circuitry of the first path.

Figure 17:
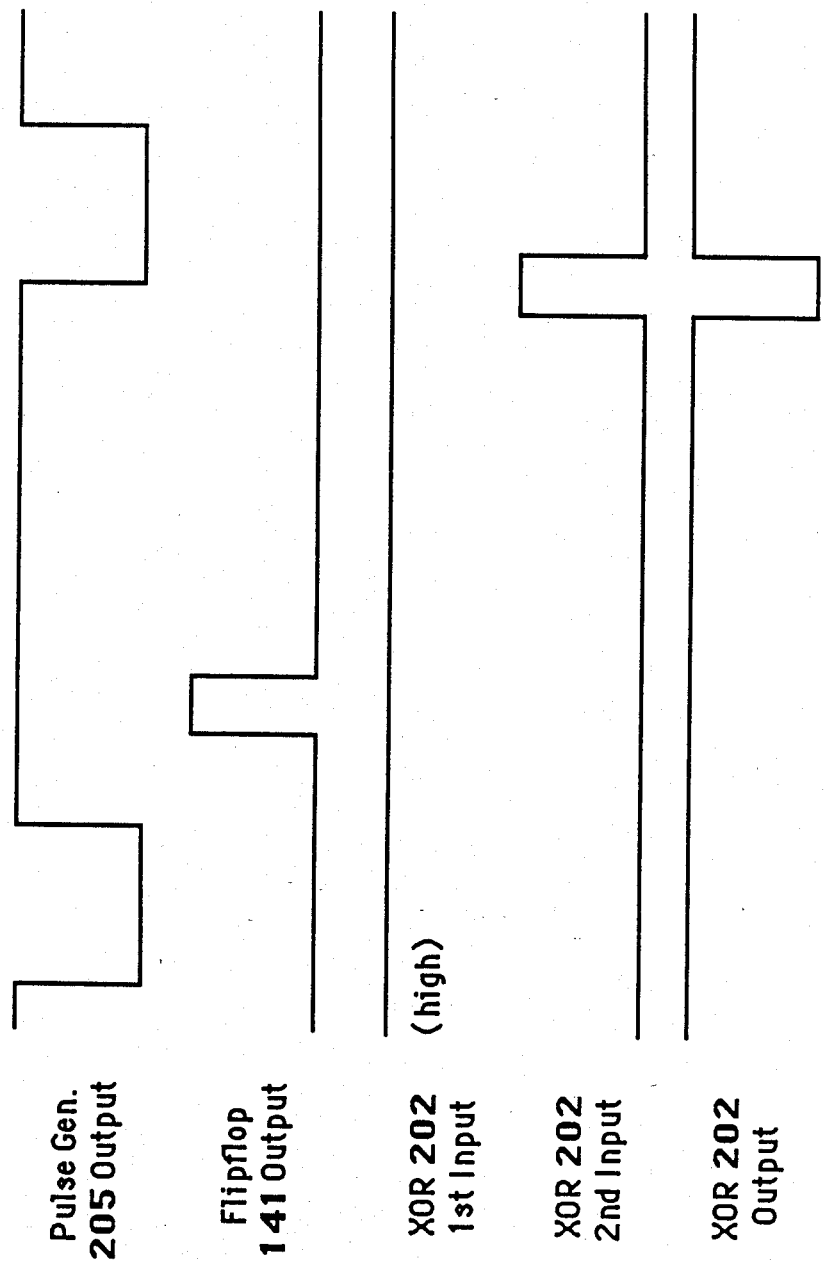
FIG. 17 is a diagram similar to FIG. 16 showing the timing relationships of the signals during second path rising-edge timing calibration.

When timing calibration of the second path is performed, the input from the first path circuitry to XOR gate 202 is held constant (refer to FIG. 17). Pulse generator 205 is set to output a low-going (normally high) pulse, which clocks the falling-edge triggered flipflop 141. With FESN circuitry (FIG. 14) enabled to reset the flipflop when its output goes on (producing a high-going pulse), the first path input to XOR gate 202 is held high and pulse generator 205 is set to trigger on the falling edge of the returning signal (which is the output of XOR gate 202). This allows determination of the rising-edge delay of the path. For falling-edge timing, the FESN circuitry is set to cause flipflop 141 to be set on when its output goes off (producing a low-going pulse). The input to XOR gate 202 is held low, and pulse generator 205 is still set to trigger on the falling edge of the return signal.

In FIG. 14, note that the pulse-producing circuitry (gates 144 and 145) connect to all flipflops present (such as 141 and 142) on the FESN; resistors 146 and 147 terminate the lines. (Termination resistors associated with other of the circuitry in FIG. 14 are not shown.)

Repeater Network Circuitry Implementation

FESN and DA repeater network circuitry allow information developed at the PCB to be sent out over the backplane and return information to be received in. Alternatively, the network circuitry may be instructed to simply pass along (repeater) whatever information other PCB's on the backplane are communicating.

The principal advantages in using an active-device signalling scheme over a conventional backplane buss arrangement are:

Arranging FESN's into groups (FIG. 5) of arbitrary size may be accomplished without having to provide manual jumpering means on the backplane to selectively section up the backplane buss, and without having to provide manual jumpering means to selectively connect in termination resistors at the ends of the buss sections;

PCB's can be placed on extenders for system troubleshooting without affecting signal communication among the PCB's;

repeater network circuitry can be implemented with conventional gates, not requiring gates capable of driving a double-terminated buss (which typically exhibit a lower bandwidth);

the short interconnection distances from one repeater to the next along the backplane imply that there will be less sensitivity to impedance mismatches between the signal lines and terminating resistors, which implies the timing delay characteristics will be less sensitive to variations in signal frquency and duty cycle.

Figure 18:
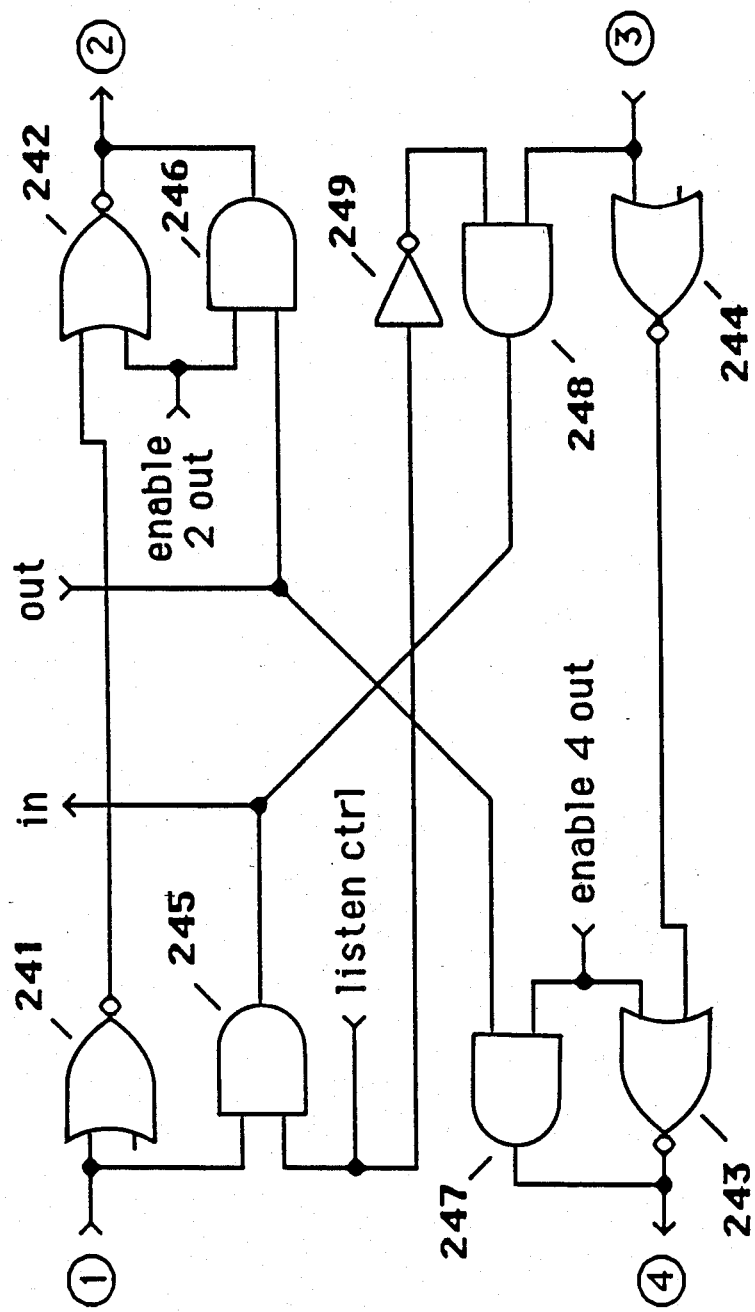
FIG. 18 shows circuitry used to implement the repeater networks of FIGS. 6 and 7.

FIG. 18 shows the implementation of the repeater network circuitry (termination resistors not shown). Signals coming from either input 1 or input 3 may be selected. "Listen ctrl" enables gate 245 or 248 (their outputs are OR-tied). Signals developed by the PCB may be sent out output 2 ("enable 2 out" high) and/or output 4 ("enable 4 out" high). Output 2 simply repeaters input 1 if "enable 2 out" is low; likewise output 4 repeaters input 3 if "enable 4 out" is low.

Signals passed along the repeatered buss are inverted twice at each PCB (e.g., through gate 241 and 242 or through gate 244 and 243). This is done to make the rising-edge and falling-edge delay times through the network as nearly equal as possible. (Gates 241, 242, 243 and 244 are the same IC and can be type MC10H102 manufactured by Motorola, Inc.; likewise gates 245, 246, 247 and 248 are the same IC and can be type MC10H104 also manufactured by Motorola, Inc.) This is important because pulse width distortion occurs otherwise; the amount of rising-edge/falling-edge skew determines the minimum pulse width which can be handled in the system. No matter whether a rising- or falling-edge signal is present, both a low-to-high and high-to-low gate delay are experienced by the signal.

The requirement exists, as already discussed, that the delay in one direction along the repeatered buss be identical to the delay in the other direction (i.e., mirror-symmetric). Since the various PCB's of a given type (FESN, for instance) are implemented identically, an unintentional bias can result with identical delays not being achieved. This is because the characteristics of the gates of a given type of IC often do not have a uniform distribution; in other words, one gate of the IC may always (typically) have a slightly different propagation than its neighbor due to fabrication-related considerations.

For example, if instances of the circuitry of FIG. 18 were connected together along a backplane to form an active buss and the propagation delay of gate 241 were slightly slower than that of gates 242, 243 and 244, the left-to-right delay along the buss would be greater than the right-to-left delay. While the difference would be minimal for a buss composed of just one instance of the circuitry, the difference would increase as the buss grew in size.

Therefore, an "anti-bias" scheme is used in connecting the networks. Rather than linking signals 2 to 1, 2 to 1, ... and 4 to 3, 4 to 3, ... down the backplane, instead signals 2 and 3 from one PCB connect to 3 and 2 respectively of the PCB on one side, and signals 1 and 4 connect to 4 and 1 respectively of the PCB on the other side. This insures that any non-mirror-image characteristics show up equally in both directions. Because of these "anti-bias" cross-connections, the network circuitry must be able to signal out and receive in from either direction.

Adjustable Delay Implementation

Two essential characteristics required of the adjustable delay 61 (FIG. 7) are wide bandwidth and stable propagation delay. Furthermore, there is the requirement that the rising-edge in to rising-edge out and falling-edge in to falling-edge out delays be independently adjustable.

Figure 19:
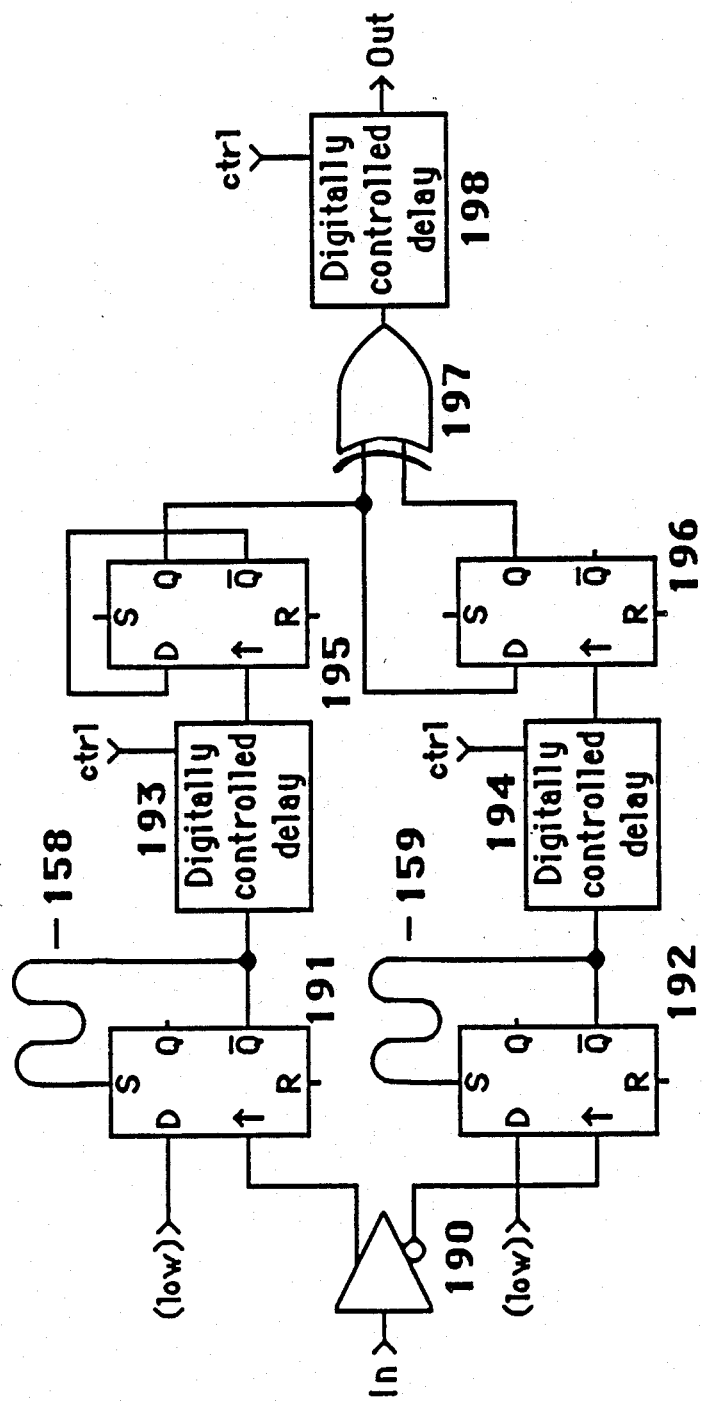
FIG. 19 shows the manner in which the adjustable delays of FIG. 7 are implemented.

FIG. 19 shows the circuitry used (termination resistors not shown). Two pulse trains are produced from the input signal; the pulses are then recombined back into a single output. The delay experienced by each pulse train is controllable and independent of the delay experienced by the other pulse train.

The input is applied to gate 190. This gate has both true and inverted outputs, which respectively clock flipflops 191 and 192. Flipflop 191 in conjunction with delay line 158 (simply a length of signal line on the DA PCB) produces a series of high-going pulses, one pulse produced at each rising edge of the input to gate 190. Flipflop 192 in conjunction with delay line 159 produces a series of high-going pulses, one pulse produced at each falling edge of the input to gate 190. The width of the pulses output by flipflops 191 and 192 are made short enough so that a high data rate input to gate 190 can be handled, yet long enough so that the pulses can propagate through digitally-controlled delays 193 and 194 and clock flipflops 195 and 196.

Digitally-controllable delays 193 and 194 delay each pulse train by the desired amount (that determined to be necessary in the calibration procedure described above). Flipflop 195 toggles when the rising edge of a pulse from the first delay 193 arrives at its clock input. Flipflop 196 has the true output of flipflop 195 connected to its D input so that it mimics the state of flipflop 195 as soon as the rising edge of a pulse from the second delay 194 arrives at its clock input. By combining the flipflops' outputs, XOR gate 197 recreates a single signal once again.

In order to minimize the additional rising-edge/falling-edge skew introduced by the circuitry of FIG. 19 itself, the delays through the upper and lower sections are made nominally the same. This is accomplished in part by having flipflops 191 and 192 be from the same IC (likewise for flipflops 195 and 196).

For reasons of economy, three smaller controllable delays are implemented, rather than two larger controllable delays. Delays 193 and 194 handle small values of signal delay while delay 198 handles larger values. Thus, the overall rising-edge delay is affected by the settings of both 193 and 198, while the overall falling-edge delay is affected by the settings of both 194 and 198.

Figure 20:
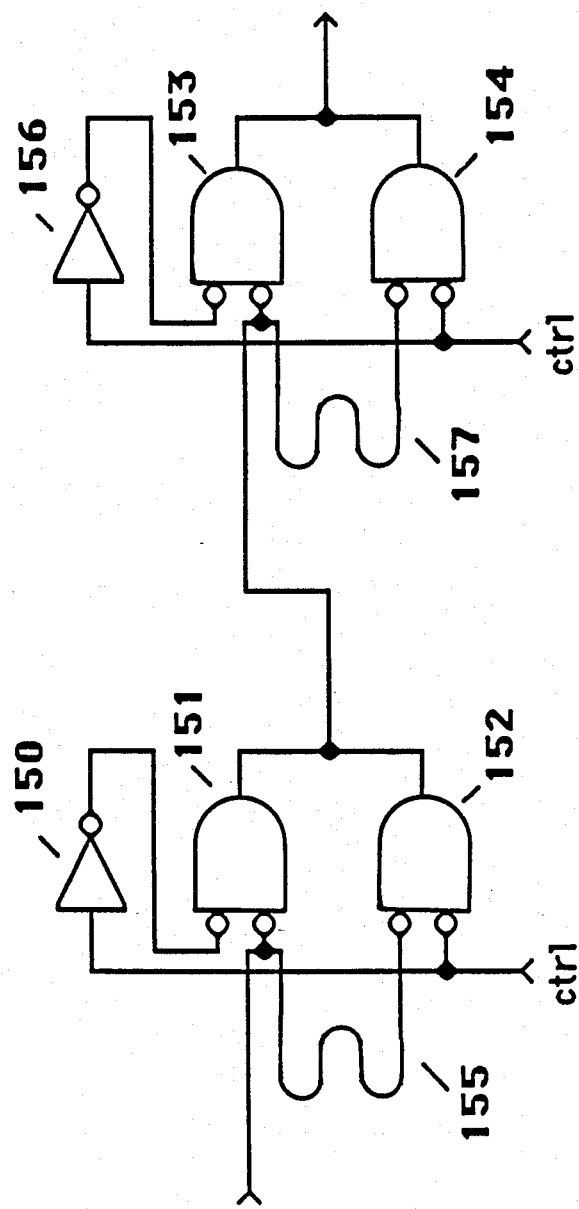
FIG. 20 shows two sections of the digitally-controllable delays used in implementing the adjustable delays of FIG. 19.

Each digitally-controllable delay produces a delay whose value depends upon a digital control value. FIG. 20 illustrates two sections of the circuitry used to implement the controllable delays (termination resistors not shown). At the first stage, a control signal "ctrl" (one bit of the digital control value), input via inverter 150, directs a gate such as 151 to pass the incoming signal without delay, or it directs a gate such as 152 to pass the signal which has been delayed by a delay line such as 155. (The output of the gates is wire-OR'ed as shown.) This signal is input to a second section composed of inverter 156, gates 153 and 154 and delay line 157. The second section is configured like the first section. The delay of one delay line, such as 157, will typically be twice the delay of its predecessor on the left, such as 155. Therefore the overall delay is proportional to the binary value of the control signals applied (actually, the total delay through the circuitry is not controlled; it is the incremental delay which is proportional to the binary control value).

Delays 193 and 194 (FIG. 19) are composed of six binary-weighted delay sections; delay 198 is composed of four sections. Delays 193 and 194 can produce incremental delays of up to approximately 4 nanoseconds, while 198 can produce delays up to approximately 60 nanoseconds (4 nanosecond increments).

In FIG. 20, gates such as 151 and 152 come from the same IC. Therefore, the delay characteristics of the gates has little influence upon the incremental delay value produced. In other words, the difference in the delay when the control signal is in one state versus the other depends essentially only upon the propagation delay along the delay line (such as 155). Furthermore, gates such as 153 and 154 are also from the same IC as 151 and 152. Therefore, since the signal experiences a double inversion as it passes through every two sections (no matter what the control setting), the rising-edge/-falling-edge skew is minimized. This means that narrower pulses can be produced by flipflops 191 and 192 (FIG. 19), which allows higher data rate signals to be handled at the input 190.

By providing separate controls to the gates of the last section of delay 198, as well as by OR-tying an additional gate to the output, the requirement is met to be able to force the output of 61 (FIG. 7) both high and low for timing calibration purposes (refer to *FESN Support For Higher Frequency Signals*).

Pulse Generator Implementation

Pulse generator 205 (FIG. 7) is responsible for regenerating the pulses sent around the multiplexer subsystem when timing calibration is performed. It is necessary to be able to control not only the polarity of the input trigger and output signals, but also the width of the pulse as well as a delay time before production of the next pulse begins.

For example, in FIG. 7, one timing calibration step involves setting multiplexer 204 to select the pulse generator output. Clearly, without a "pre-pulse" delay, the pulse generator would be called upon to output a new pulse before production of the old one was complete! Again, consider FIG. 11, which implicitly illustrates the requirement that, for BON cable timing calibration, the width of the pulse used must be somewhat greater than $2t_{BON}$; likewise, a sunsequent pulse must not occur for a similar length of time.

Figure 21:
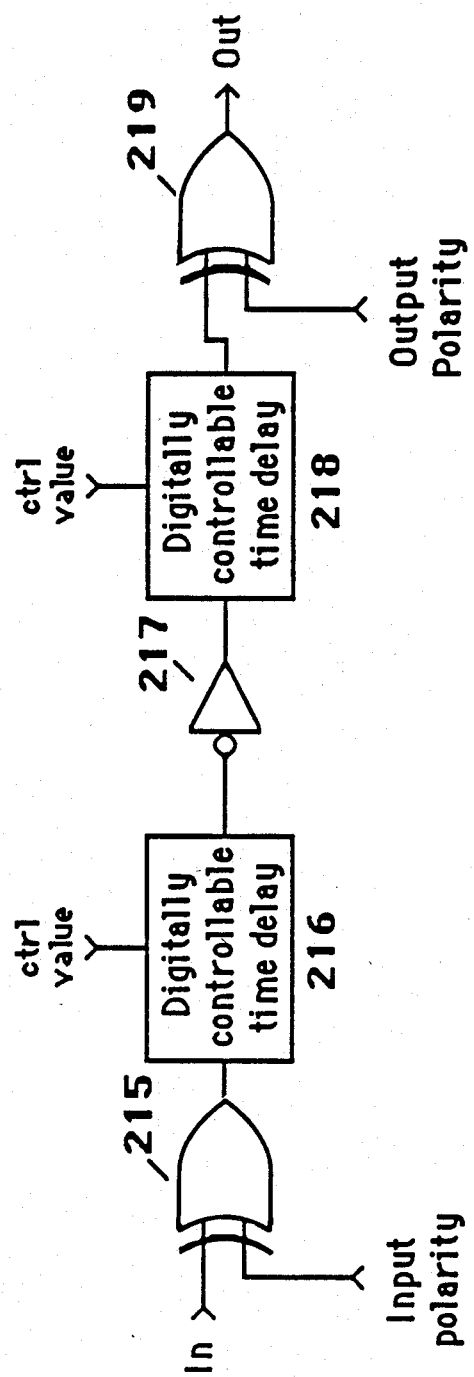
FIG. 21 shows the manner in which the timing calibration pulse generator of FIG. 7 is implemented.

Unlike the adjustable delay (61, FIG. 7), the pulse generator is not in the main signal path; therefore, it need not support a wide bandwidth. This is economically important, since the implementation of delay 61 requires much space allocated on the DA PCB for signal-delaying traces and/or the use of discrete cabling. Therefore, as shown in FIG. 21, the pulse generator is implemented simply using two time delays.

The time delays, 216 and 218, trigger on the rising edge of the input signal and produce a high-going (normally low) output. Inverter 217 is used to cause time delay 218 to trigger when the trailing edge of the output from 216 occurs. The first time delay controls the pulse wait time, and the second controls the width of the pulse output. XOR gates 215 and 219 allow control of the input trigger and output polarities. Additional circuitry under control of microprocessor 173 (FIG. 7) provides means to disable the pulse generator (to prevent it from responding to input signals) as well as to trigger it into operation (independent of the In signal shown in FIG. 21).

Figure 22:
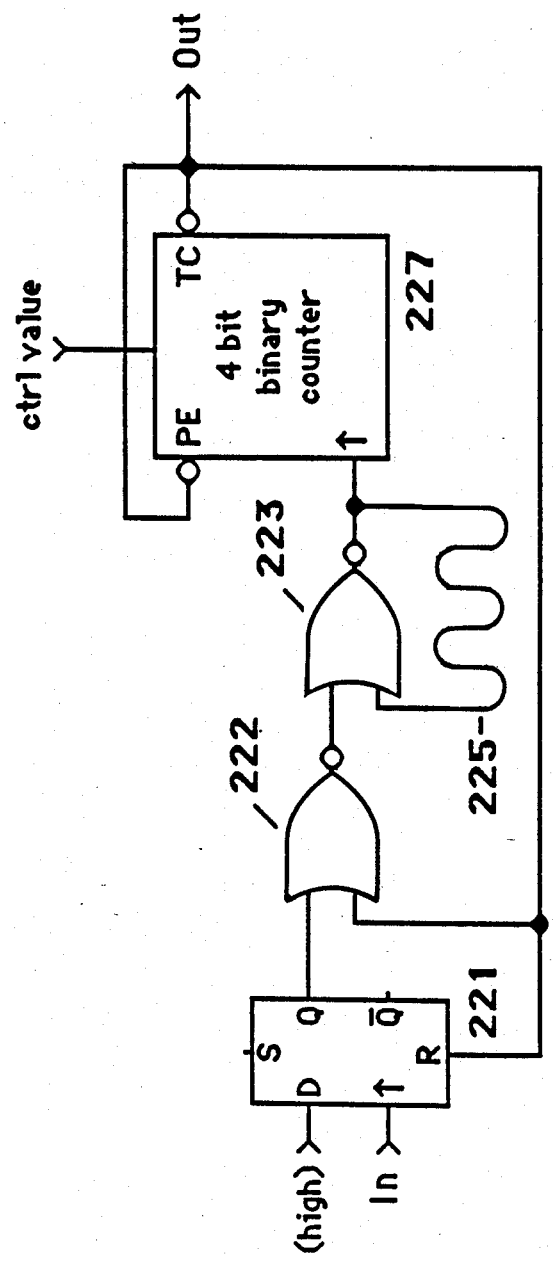
FIG. 22 shows details of the digitally-controllable time delays used in FIG. 21.

FIG. 22 shows the implementation of a time delay (termination resistors not shown). A digital control value "ctrl value" is applied to the preset inputs of binary counter 227, specifying the time delay desired. Normally, the counter is in state 15; the "TC" output is low (asserted), and flipflop 221 is normally off. The output of gate 222 will be high, therefore, and the output of gate 223 will be low. The counter can be type MC10H016 manufactured by Motorola, Inc.

When a rising edge is seen at the clock input of 221, the flipflop output goes high; the output of gate 222 goes low. This enables the oscillator composed of gate 223 and delay line 225 to start oscillating. The counter loads the preset value in at the first rising edge of its clock. Since the counter is no longer in state 15, the "TC" output goes high, thereby keeping the output of gate 222 low and resetting flipflop 221. From that point the counter counts upwards toward state 15 with each successive rising edge of the clock. When state 15 is reached, the "TC" output goes low; this causes the output of gate 222 to go high which forces the output of gate 223 to go low. Everything stays as it is until another rising-edge trigger occurs. The circuitry implements a controllable time delay from the rising edge of the input signal to the falling edge of the output signal.

Support For Analog Measurements

It is desireable to be able to determine the voltage level present at any UUT node. Such a capability supports test of not only digital circuitry but also analog circuitry present on the UUT. Since each input from the UUT is fed to a comparator, the essential ingredient for performing conversion of the analog signal level to a digital representation is already present.

As previously discussed, the $V_{comm}$ signal can optionally be added to $V_{xref}$ (FIG. 13). Circuitry (not shown) generates a periodic linear ramp waveform on $V_{comm}$; the input comparator is thereby able to perform a comparison between the input voltage and the ramp voltage. By measuring the time from the start of the ramp to the point at which the output of the comparator changes state, the value of the analog input signal may be determined. A latch control signal (FIG. 12) is used to control operation of the internal latch of the comparator. By periodically enabling the latch prior to examination of the output of the comparator, the effective resolution of this simple conversion technique is significantly increased.

Figure 23:
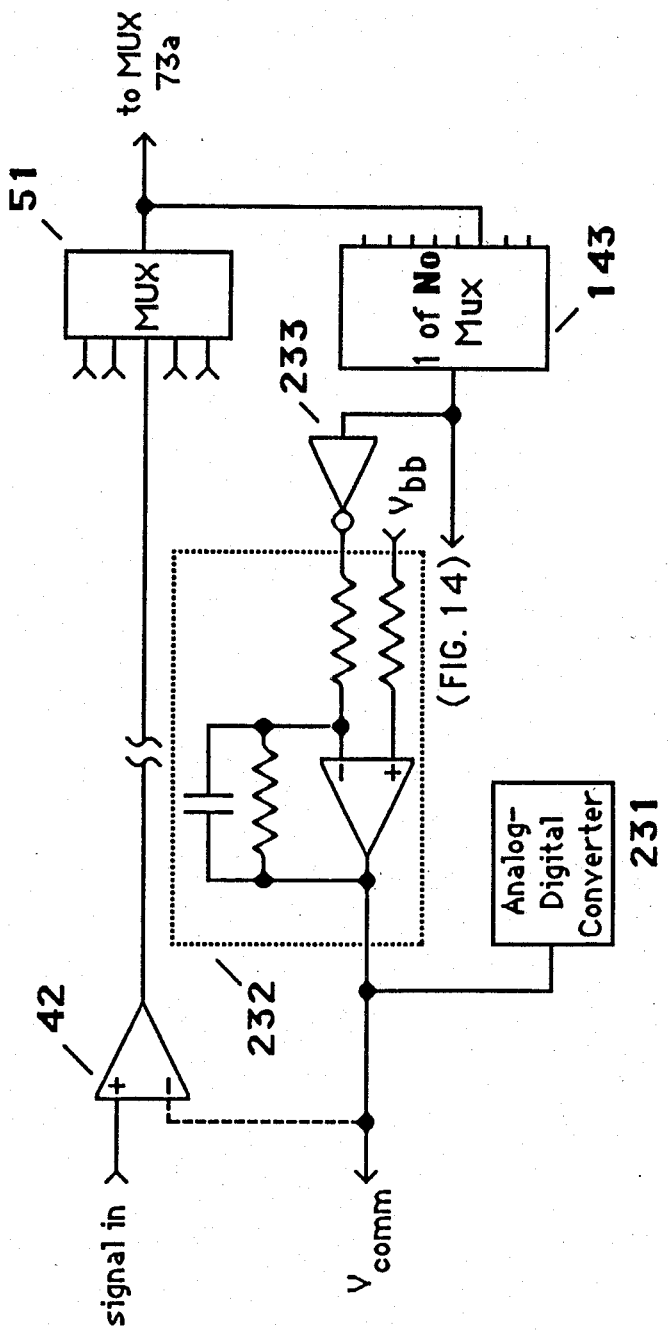
FIG. 23 shows the circuitry by which a replica of the analog signal voltage input from the BON in FIGS. 6 and 12 is output to the circuitry of FIG. 13.
Figure 24:
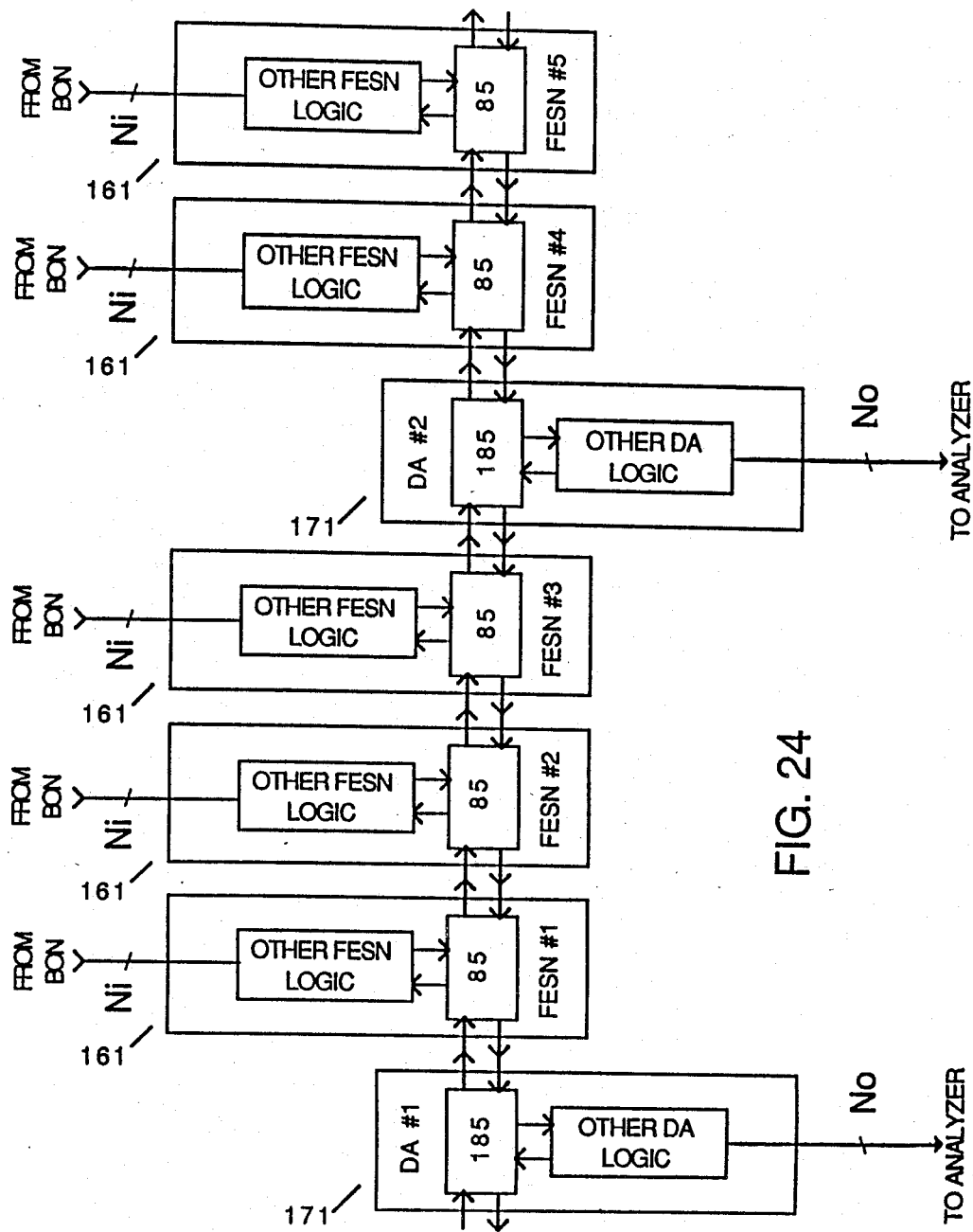
FIG. 24 is a block diagram showing the interconnections of the repeater network of FIGS. 6 and 7.

Support is also provided for a more precise and less noise-sensitive (although possibly slower) conversion technique. As shown in FIG. 23, an integrator (232) is used to recreate a replica of the analog input signal. The integrator's output may be connected to drive the $V_{comm}$ signal line, which can affect the reference input of the comparator. As the input signal rises in voltage, the comparator's output is high; this causes the output of the integrator, whose input is connected to inverter 233 (and $V_{bb}$, the ECL midpoint voltage), to also rise. Similarly, as the input signal falls, $V_{comm}$ falls. In the steady state, $V_{comm}$ will oscillate as the input signal is tracked.

Circuitry 231 performs an analog-to-digital conversion on $V_{comm}$, the replica of the input signal. With an integrating type (e.g., dual slope) converter, the loop oscillations of $V_{comm}$, along with input signal noise and comparator output glitches, are all integrated out. Power line noise, of course, may be integrated out also, if the integration period of the converter is an integer multiple of the power line cycle period. (Ripple from the memDAC, FIG. 13, may also be integrated out; the time taken to cycle through all RAM addresses is therefore chosen to be a submultiple of the power line cycle period.) With another type of converter (e.g., successive approximation), a filter must be used to remove the loop oscillations.

Determination of other characteristics of the analog input signal may be made, such as frequency, duty cycle, average amplitude, extreme values, rise/fall times, etc.; this may be accomplished digitally through processing of the output of the converter. Alternatively, use may be made of analog instrumentation which directly examines the analog voltage present at the output of integrator 232.

While a preferred embodiment of the invention has been shown and described, it will be apparent to those skilled in the art that many other changes and modifications may be made without departing from the invention in its broader aspects. It is therefore intended that the appended claims cover all such changes and modifications coming within the spirit and scope of the accompanying claims.

What is claimed is:

1. A system for high performance testing of a printed circuit board (PCB) having a first plurality of test nodes, comprising:
   a multiprobe test fixture having a second plurality of test probes for contacting said test nodes to sense a number up to said first plurality of test signals on the PCB, including test signals having high frequency components;
   a high speed test signal analyzer having a third plurality of inputs for simultaneously receiving a number of said test signals and analyzing same, the second plurality being substantially larger than the third plurality;
   multiplexing means interconnecting the test fixture and the analyzer for multiplexing said number of test signals down to a number not exceeding said third plurality for input to the analyzer; and
   test signal transmission means coupling each test probe to an input of the multiplexing means for transmitting each of said test signals from the respective test node through the multiplexing means via a selected transmission path to one of said inputs of the analyzer;
   said transmission paths being arranged to transmit the test signals with minimal transient loading of the test nodes, minimal transient distortion of the test signals and minimal skewing of the relative timing of the test signals so that the real-time behavior of the test signals can be accurately observed and analyzed.

2. Apparatus according to claim 1 in which the multiplexing means includes a first multiplexer having a first output and a first subset of said test signals as inputs and a second multiplexer having a second output and a second subset of said test signals as inputs, the first and second subsets having one or more test signals in common so that the common test signals can be selected for output from one or the other or both of the multiplexer outputs.

3. Apparatus according to claim 1, in which the test signal transmission means includes a transmission line having an input impedance means at the test probe defining a resistance and a first and second capacitance such that a time constant of said resistance and said first capacitance is substantially equal to a time constant of a characteristic impedance of said transmission line and said second capacitance.

4. A system for high performance testing of a printed circuit board (PCB) having a first plurality of test nodes, comprising:
   a multiprobe test fixture having a second plurality of test probes for contacting said test nodes to sense a number up to said first plurality of test signals on the PCB, including test signals having high frequency components;
   a high speed test signal analyzer having a third plurality of inputs for simultaneously receiving a number of said test signals and analyzing same, the second plurality being substantially larger than the third plurality;
   multiplexing means interconnecting the test fixture and the analyzer for multiplexing said number of test signals sensed by the test probes down to a number not exceeding said third plurality for input to the analyzer;
   test signal transmission means coupled to each test probe for transmitting each of said test signals from the respective test node through the multiplexing means to one of said inputs of the analyzer;
   means for providing a high impedance in the test probe to minimize loading of the PCB at said test nodes;
   a transmission line electrically coupling each test signal from its respective test probe to an input of the multiplexer; and
   means for terminating the transmission line in a termination impedance substantially equal to a characteristic impedance of the transmission line.

5. A system for high performance testing of a printed circuit board (PCB) having a first plurality of test nodes, comprising:
   a multiprobe test fixture having a second plurality of test probes for contacting said test nodes to sense a number up to said first plurality of test signals on the PCB, including test signals having high frequency components;
   a high speed test signal analyzer having a third plurality of inputs for simultaneously receiving a number of said test signals and analyzing same, the second plurality being substantially larger than the third plurality;
   multiplexing means interconnecting the test fixture and the analyzer for multiplexing said number of test signals sensed by the test probes down to a number not exceeding said third plurality for input to the analyzer;
   test signal transmission means coupled to each test probe for transmitting each of said test signals from the respective test node through the multiplexing means to one of said inputs of the analyzer;

the test signal transmission means including a transmission line electrically coupling each test probe to an input of the multiplexer and means for terminating the transmission line in a termination impedance substantially equal to a characteristic impedance of the transmission line.

6. Apparatus according to claim 5, in which the test signal transmission means includes means for providing a high impedance in the test probe to minimize loading of the PCB at said test nodes.

7. Apparatus according to claim 5, including a comparator in each input to the multiplexing means, each comparator having a reference level for distinguishing logic states of the test signal and outputting a regenerated test signal to the analyzer.

8. Apparatus according to claim 7 including a resistance in each test probe greater than the characteristic impedance of the transmission line.

9. Apparatus according to claim 7 including means for varying the reference level of the comparator so that a determination can be made of analog voltage level of the test signal.

10. Apparatus according to claim 5 in which the second plurality of test probes includes a number of test probes positioned for contacting ground nodes on the printed circuit board, the test signal transmission means including a first conductor connected to each test probe for transmitting a signal from each test node and a second conductor coupled to at least one of the test probes contacting said ground nodes; the test probes for contacting ground nodes being physically located near test probes for contacting said test nodes.

11. A system for high performance testing of a printed circuit board (PCB) having a first plurality of test nodes, comprising:

a multiprobe test fixture having a second plurality of test probes for contacting said test nodes to sense a number up to said first plurality of test signals on the PCB, including test signals having high frequency components;

a high speed test signal analyzer having a third plurality of inputs for simultaneously receiving a number of said test signals and analyzing same, the second plurality being substantially larger than the third plurality;

multiplexing means interconnecting the test fixture and the analyzer for multiplexing said number of test signals sensed by the test probes down to a number not exceeding said third plurality for input to the analyzer;

test signal transmission means coupled to each test probe for transmitting each of said test signals from the respective test node through the multiplexing means to one of said inputs of the analyzer;

the test signal transmission means including a transmission line and an input impedance means at the test probe defining a resistance and capacitance having a time constant that is substantially less than a minimum pulse width of the test signals, the resistance being greater than a characteristic impedance of the transmission line.

12. Apparatus according to claim 11, including a comparator in each input to the multiplexing means, each comparator having a reference level for distinguishing logic states of the sensed test signal and outputting a regenerated test signal to the analyzer.

13. A system for high performance testing of a printed circuit board (PCB) having a first plurality of test nodes, comprising:

a multiprobe test fixture having a second plurality of test probes for contacting said test nodes to sense a number up to said first plurality of test signals on the PCB, including test signals having high frequency components;

a high speed test signal analyzer having a third plurality of inputs for simultaneously receiving a number of said test signals and analyzing same, the second plurality being substantially larger than the third plurality;

multiplexing means interconnecting the test fixture and the analyzer for multiplexing said number of test signals sensed by the test probes down to a number not exceeding said third plurality for input to the analyzer;

test signal transmission means coupled to each test probe for transmitting each of said test signals from the respective test node through the multiplexing means to one of said inputs of the analyzer;

the multiplexing means including delay means for matching automatically, under algorithmic control, a relative timing of the test signals input to the analyzer with a relative timing of the signals sensed at the test nodes.

14. Apparatus according to claim 13, in which each output from the multiplexing means to the analyzer includes one of said delaying means.

15. Apparatus according to claim 13, in which each multiplexing means includes means defining a first closed loop path, means for generating a signal within said first path, means for receiving the signal to determine a first closed loop propagation time, and means defining a second closed loop path having a first portion coinciding with the first loop and including said generating and receiving means and a second portion non-coincident with the first path, the receiving means being operative to determine a second closed loop propagation time, and means for determining an open loop propagation delay from said first and second closed loop propagation times.

16. Apparatus according to claim 13, in which each multiplexing means includes means for determining certain circuitry propagation delays, said means including a first group of circuitry and a second group of circuitry, said first group including pulse generation means for signal regeneration, frequency counter means for determining signal periodicity and a first multiplexer means for selecting either a first or second signal to be input to said pulse generation means, said first signal being the output of said pulse generation means thereby facilitating configuration of said first group of circuitry into a first closed loop, and said second signal being produced by said second group of circuitry, said second group of circuitry including at least a second multiplexer means for selecting either a third or fourth signal to be propagated through the second-group circuitry and output as said second signal, said third signal being the output of said pulse generation means thereby facilitating configuration of said second group of circuitry into a second closed loop, said fourth signal being produced by a third group of circuitry associated with said multiplexing means, said second closed loop having a first portion incorporating said pulse generation means, said frequency counter means and said first multiplexer means of said first group of circuitry and a second portion coincident with said second group of circuitry, said pulse generation means, said frequency counter means and said first multiplexer means being operative to determine signal propagation time around said first closed loop, said pulse generation means, said frequency counter means, said first multiplexer means and said second multiplexer means being operative to determine signal propagation time around said second closed loop, and computer means for algorithmically determining progagation delay through said second portion of circuitry from the first closed loop propagation time and second closed loop propagation time.

17. A system according to claim 13, in which the multiplexing means includes a crossbar signal switching means having at least two test signal inputs coupled in one-to-one correspondence to a like number of the test probes and at least two outputs coupled to the analyzer inputs and arranged to output any one of the test signal inputs to any one or more of said outputs.

18. Apparatus according to claim 13, in which the test signal analyzer includes a logic analyzer state analysis means for analyzing the test signals.

19. Apparatus according to claim 13 in which the multiplexing means includes means for distribution of a fourth plurality of timing calibration signals from an equal number of timing calibration signal distribution points to a fifth plurality of timing calibration signal inputs of the multiplexing means, each of said points being connected to a group comprised of a sixth plurality of timing calibration signal inputs such that the sixth plurality is numerically equal to the value of the fifth plurality divided by the value of the fourth plurality, each of said points being connected to each timing calibration signal input of the group via a seventh plurality of signal paths such that a sum of individual signal propagation delays from the point to one of the inputs in the group over each of the seventh plurality of signal paths is substantially the same as a sum of individual signal propagation delays from the point to another of the inputs in the group over each of the seventh plurality of signal paths.

20. Apparatus according to claim 19 in which a sum of timing calibration signal propagation delays associated with one input of a group substantially matches sums associated with all other inputs of the group.

21. Apparatus according to claim 19 in which the seventh plurality has a numerical value of 2.

22. Apparatus according to claim 19 in which the timing calibration signal inputs of a group are connected to a transmission line in such a way that a uniform characteristic impedance results, including means for driving the transmission line from either of its two ends with signals communicated from the timing calibration signal distribution point of the group, a sum of a signal propagation delay from the point to any input along the transmission line via one end of the transmission line and a signal propagation delay from the point to the same input along the transmission line via the other end of the transmission line being substantially the same as a sum of propagation delays for any other input along the transmission line.

23. A system for high performance testing of a printed circuit board (PCB) having a first plurality of test nodes, comprising:
a multiprobe test fixture having a second plurality of test probes for contacting said test nodes to sense a number up to said first plurality of test signals on the PCB, including test signals having high frequency components;
a high speed test signal analyzer having a third plurality of inputs for simultaneously receiving a number of said test signals and analyzing same, the second plurality being substantially larger than the third plurality;
multiplexing means interconnecting the test fixture and the analyzer for multiplexing said number of test signals sensed by the test probes down to a number not exceeding said third plurality for input to the analyzer;
test signal transmission means coupled to each test probe for transmitting each of said test signals from the respective test node through the multiplexing means to one of said inputs of the analyzer; and
transmission means including a transmission line for transmitting each signal to the multiplexing means with substantially the same AC characteristics as the characteristics of the signals at the test nodes.

24. Apparatus according to claim 23, including a buffering amplifier means at each input to the multiplexing means having a high impedance input for regenerating the test signals.

25. Apparatus according to claim 24, in which the buffering amplifier means includes a comparator having a reference level for distinguishing logic states of the sensed test signal and outputting a regenerated test signal to the analyzer.

26. Apparatus according to claim 23, including means for terminating the transmission line in a termination impedance substantially equal to a characteristic impedance of the transmission line.

27. Apparatus according to claim 26, in which the termination impedance is connected to a predetermined terminating voltage.

28. A system for testing a printed circuit board (PCB) having a plurality of test nodes, comprising:
a test probe means for contacting a test node to sense a test signal on the PCB;
a test instrument means having an input for receiving and analyzing said test signal;
means for providing a high input impedance in the test probe to minimize loading of the PCB at said test node;
means for regenerating the test signal for input to the test instrument means;
a transmission line electrically coupling the test probe to an input of the regenerating means;
the regenerating means having a high input impedance such that there is substantially no current flowing through the input of the regenerating means.

29. Apparatus according to claim 28 in which the regenerating means includes a comparator having a reference level for distinguishing logic states of the sensed test signal and outputting an amplified test signal to the analyzer.

30. Apparatus according to claim 29 including means for varying the reference level of the comparator so that a determination can be made of an analog voltage level of the test signal.

31. Apparatus according to claim 30 including means for determining a difference in time from when a variation in the reference level commences until the output of the comparator changes state and means for determining the analog voltage level of the test signal from the time difference and the reference level variation.

32. Apparatus according to claim 30 including means for varying the reference level in accordance with an output of the comparator integrated over time and means for determining the analog voltage level of the test signal from said integrated output.

33. Apparatus according to claim 28, including means for terminating the transmission line at the regenerator means input in a termination impedance substantially equal to a characteristic impedance of the transmission line.

34. Apparatus according to claim 28, in which the transmission line and high input impedance means include resistive and reactive components having a time constant that is substantially less than a minimum pulse width of the test signals.

35. Apparatus according to claim 28, in which the transmission line and high impedance means includes a resistive and a first and second reactive component such that a time constant of said resistive and said first reactive components is substantially equal to a time constant of a characteristic impedance of said transmission line and said second reactive component.

36. A system for testing a printed circuit board (PCB) having a plurality of test nodes, comprising:
a test probe means for contacting a test node to sense a test signal on the PCB;
a test instrument means having an input for receiving and analyzing said test signal;
means for providing a high input impedance in the test probe to minimize loading of the PCB at said test node;
means for regenerating the test signal for input to the test instrument means;
a transmission line electrically coupling the test probe to an input of the regenerating means; and
means for terminating the transmission line in a termination impedance substantially equal to a characteristic impedance of the transmission line;
the termination impedance being connected to a predetermined terminating voltage.

37. Apparatus according to claim 36, in which the regenerating means includes a high-input impedance amplifier.

38. A system for testing a printed circuit board (PCB) having a plurality of test nodes, comprising:
a test probe means for contacting a test node to sense a test signal on the PCB;
a test instrument means having an input for receiving and analyzing said test signal;
means for providing a high input impedance in the test probe to minimize loading of the PCB at said test node;
means for regenerating the test signal for input to the test instrument means;
a transmission line electrically coupling the test probe to an input of the regenerating means; and
delay means for adjusting automatically, under algorithmic control, a propagation delay of the signal sensed at the test node from the test probe to the test instrument input.

39. Apparatus according to claim 38, including:
selectable means defining a first and second closed loops, each loop having a coextensive first portion and a separate second portion;
the first portion of both loops including:
means for generating a periodic signal and passing the signal through the closed loops with first and second periods of oscillation determined by the respective delays within each loop; and
receiving means for receiving the periodic signals in each loop and measuring said delays therefrom;
the second portion of the first loop having a negligible delay; and
the second portion of the second loop including said delay means; and
delay control means responsive to the measured delays for determining the delay through the second portion of the second loop and adjusting the delay means to provide a predetermined delay therethrough.

40. Apparatus according to claim 39, in which the selectable means includes:
first multiplexing means in the first portion of said loops for selecting between the first and second loops to pass the periodic signal therethrough;
second multiplexing means in the second portion of the second loop for selecting between passing the periodic signal around the second loop and passing the test signal through the second portion of the second loop.

41. Apparatus according to claim 40, including means defining a mirror-symmetric signal path for transmitting a signal around a third closed loop with a total loop delay equal to twice a delay from an end point in the loop to a midpoint thereof, the mirror-symmetric path including:
an input signal path for inputting the test signal from the test probe to the second portion of the second loop to pass through the delay means;
a parallel output signal path for transmitting the periodic signal toward the test probe to said midpoint; and
means for selectably coupling the output and input signal paths at said midpoint to form said third loop;
the selectable coupling means having said test signal as an input for transmission through the input signal path to the second multiplexing means; and
the selectable coupling means and the second multiplexing means being jointly operable to transmit the test signal through the second portion of the second loop including said delay means to the test instrument.

42. Apparatus according to claim 41, in which the selectable coupling means and the second multiplexing means are operable jointly with the periodic signal generating means and receiving means to transmit and receive the periodic signal through the third loop to determine said total loop delay, said delay control means being responsive to determine a series delay comprising a sum of one-half of the total loop delay and the delay through the second portion of the second loop and adjusting the delay means in accordance therewith.

43. Apparatus according to claim 42, including means defining a fourth loop including the signal generating means connected to the third loop at said midpoint, the selectable coupling means including means for passing the periodic signal from the output signal path around the fourth loop to the input signal path to determine a fourth loop delay, the delay control means being operable to determine from the fourth loop delay an open loop delay from the input for the test signal to the regenerator means to said midpoint.

44. Apparatus according to claim 39, including means for detecting a reflection of the periodic signal from the test probe and determining a round trip delay of the transmission line therefrom.

45. Apparatus according to claim 40, including output means for outputting the test signal to the test instrument and selectable means defining a fifth closed loop connected to the second loop for sending the periodic signal through the output means and back to the receiving means to determine a delay of the output means.

46. A method for testing printed circuit boards having a first plurality of test nodes, comprising:
providing a test fixture having a second plurality of test probes for sensing electrical test signals at said test nodes;
providing a test instrument having a third plurality of inputs for simultaneously receiving a number of said test signals and analyzing same;
transmitting each of the sensed test signals to a high input impedance regenerating means for producing a second plurality of regenerated test signals with minimal transient loading of the test nodes and minimal transient distortion of the test signals;
multiplexing the number of regenerated test signals from said second plurality down to a reduced number; and
inputting the reduced number of test signals to the test instrument inputs
with minimal skewing of the relative timing of the test signals so that the real-time behavior of the test signals can be accurately observed and analyzed.

47. A method according to claim 46 including resistively attenuating the test signals at the test probes and amplifying the test signal to minimize loading the test nodes.

48. A method according to claim 46 in which transmitting includes coupling the test probes to inputs of a multiplexer through a transmission line having a characteristic impedance and terminating the transmission line at said inputs with an impedance matching the characteristic impedance to minimize distortion of the test signals.

49. A method according to claim 46 in which transmitting includes testing to determine a delay of each signal path from one of the test nodes to its respective input and relatively adjusting the delay in at least one of the signal paths automatically, under algorithmic control to minimize skewing the relative timing of the test signals.

50. A method of testing a printed circuit board which can have a large number of test nodes to a test instrument having a lesser number of inputs for analyzing test signals present at said test nodes, comprising:
connecting a multi-probe test fixture to the printed circuit board with a test probe in contact with each test node of interest;
providing a multiplexer subsystem having a number of outputs coupled in one-to-one correspondence to the test instrument inputs to be used and having multiple inputs coupled to the test probes and alternative signal paths selectably coupled to each multiplexer subsystem output;
providing an adjustable delay in each output of the multiplexer subsystem;
selecting a subset of said multiple inputs and alternative signal paths for transmitting selected test signals from the test nodes to the test instrument inputs to multiplex the number of input test signals down to a reduced number of output signals matching the number of test instrument inputs in use; and
adjusting automatically, under algorithmic control, relative propagation delay of the selected signal paths through the multiplexer subsystem.

51. A method of testing a printed circuit board coupled according to claim 50, including:
transmitting a test signal from each test probe to one of the multiplexer subsystem inputs;
selecting a first subset of the test signals for output to the test instrument via a first subset of said signal paths; and
selecting a second subset of the test signals for output to the test instrument via a second subset of said signal paths;
the relative propagation delay for each subset of signal paths being adjusted automatically, under algorithmic control, so that the test signals in each subset are communicated to the outputs of the multiplexer subsystem in a predetermined timing relationship relative to the timing relationship of the signals as they are input to the multiplexer subsystem.

52. A method according to claim 51 in which the predetermined relationship of the output test signals is substantially the same as the timing relationship of the input test signals.

53. A method according to claim 50 in which the test probes are coupled to the inputs of the multiplexer subsystem by test signal conductors of arbitrary length, the adjusting step including determining the relative propagation delay of the test signal conductors.

54. A method according to claim 53 including resistively attenuating the test signals at the test probes and amplifying the test signals present at the inputs to the multiplexer subsystem to minimize loading the test nodes.

55. A method according to claim 53 including configuring at least one of the test signal conductors as a transmission line.

56. A method accordingly to claim 55 in which the transmission line has a characteristic impedance, including terminating the transmission line at its input to the multiplexer subsystem with an impedance matching the characteristic impedance to minimize distortion of the test signals.

57. A system for testing printed circuit boards having a first plurality of test nodes, comprising:
a test fixture having a second plurality of test probes for sensing electrical test signals at said test nodes;
a test instrument having a third plurality of inputs for simultaneously receiving a number of said test signals and analyzing same;
multiplexing means coupled between the test fixture and the test instrument for selecting among a number of alternative test signal paths for transmitting said test signals from the test probes to the test instrument inputs and reducing the number of test signals from said second plurality down to a reduced number not exceeding said third plurality of test instrument inputs;
adjustable delay means in each signal path for imparting automatically, under algorithmic control, a predetermined relative delay to the test signals; and
delay determining means for determining automatically, under algorithmic control, the delay in each signal path.

58. Apparatus according to claim 57 in which the delay determining means includes, in each signal path, means defining a first and second closed loop paths having a first, coincident portion and a second, noncoincident portion, means located in the first, coincident portion of the closed loop paths for generating and receiving a signal within both closed loop paths to determine first and second closed loop propagation times, and means for determining an open loop propagation delay from the first and second closed loop propagation times.

59. Apparatus according to claim 58 in which:
each signal path includes a first signal path defining the first of a pair of mirror-symmetric transmission paths of arbitrary length and substantially equal transmission characteristics; and
the delay determining means includes means for transmitting a signal via a second signal path defining the second of said pair of mirror-symmetric transmission paths from the generating means and back via the first signal path to the receiving means and determining a propagation delay of the first signal path from the round trip propagation delay through the second and first signal paths.

60. Apparatus according claim 57 in which the delay determining means includes means for detecting a reflected signal from the test probe and determining an input propagation delay between the test probe and an input to the multiplexing means proportional to one-half of the round-trip propagation delay of the reflected signal.

61. A system for high performance testing of a printed circuit board (PCB) having a first plurality of test nodes, comprising:
a multiprobe test fixture having a second plurality of test probes for contacting said test nodes to sense a number up to said first plurality of test signals on the PCB, including test signals having high frequency components;
a high speed test signal analyzer having a third plurality of inputs for simultaneously receiving a number of said test signals and analyzing same, the second plurality being substantially larger than the third plurality;
multiplexing means interconnecting the test fixture and the analyzer for multiplexing said number of test signals sensed by the test probes down to a number not exceeding said third plurality for input to the analyzer;
test signal transmission means coupled to each test probe for transmitting each of said test signals from the respective test node through the multiplexing means to one of said inputs of the analyzer;
means for providing a high impedance in the test probe to minimize loading of the PCB at said test nodes; and
a transmission line electrically coupling each test probe to an input of the multiplexer;
the multiplexing means including means for amplifying each test signal.

62. Apparatus according to claim 61 in which the amplifying means is a comparator having a reference level for distinguishing logic states of the test signal and outputting an amplified test signal to the analyzer.

63. Apparatus according to claim 61 in which each input to the multiplexing means includes one of said amplifying means.

64. A system for testing a printed circuit board (PCB) having a first plurality of test nodes, comprising:
a multiprobe test fixture having a second plurality of test probes for contacting said test nodes to sense a number up to said first plurality of test signals on the PCB;
a test signal analyzer having a third plurality of inputs for simultaneously receiving a number of said test signals and analyzing same; and
crossbar signal switching means interconnecting the test fixture and the analyzer for coupling the test signals to analyzer inputs;
the crossbar signal switching means having at least two test signal inputs coupled in one to one correspondence to a like number of the test probes and at least two outputs coupled to the analyzer inputs and being arranged to output one of the test signal inputs to one or the other or both of said two outputs.

* * * * *

UNITED STATES PATENT AND TRADEMARK OFFICE
CERTIFICATE OF CORRECTION

PATENT NO. : 4,908,576
DATED : March 13, 1990
INVENTOR(S) : Daniel K. Jackson

It is certified that error appears in the above-identified patent and that said Letters Patent is hereby corrected as shown below:

| | |
|---|---|
| Cover Page, | in ABSTRACT, line 11, change "resistance" to --resistances--; |
| Column 2, | line 30, change "Jektronix" to --Tektronix®--; |
| Column 5, | line 32, change "capcitance" to --capacitance--; |
| Column 7, | line 61, change "microprocessor" to --microprocessors--; |
| Column 9, | line 3, change "along signals" to --along signal--; |
| Column 17, | line 68, change "($Rh_{lim}$) to --($R_{lim}$)--; |
| Column 22, | line 38, change "(that determined" to --(that was determined--; |
| Column 23, | line 3, change "(The output of the gates is" to --(The outputs of the gates are--; |

UNITED STATES PATENT AND TRADEMARK OFFICE
CERTIFICATE OF CORRECTION

Page 2 of 2

PATENT NO. : 4,908,576
DATED : March 13, 1990
INVENTOR(S) : Daniel K. Jackson

It is certified that error appears in the above-identified patent and that said Letters Patent is hereby corrected as shown below:

Column 33, line 52, change "nodes to a test" to --nodes by a test--.

Signed and Sealed this

Thirty-first Day of December, 1991

Attest:

HARRY F. MANBECK, JR.

*Attesting Officer*      *Commissioner of Patents and Trademarks*